United States Patent
Hu et al.

(10) Patent No.: US 11,239,205 B2
(45) Date of Patent: Feb. 1, 2022

(54) INTEGRATING PASSIVE DEVICES IN PACKAGE STRUCTURES

(71) Applicant: Taiwan Semiconductor Manufacturing Company, Ltd., Hsinchu (TW)

(72) Inventors: Chih-Chia Hu, Taipei (TW); Ming-Fa Chen, Taichung (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 1 day.

(21) Appl. No.: 16/741,003

(22) Filed: Jan. 13, 2020

(65) Prior Publication Data

US 2020/0152608 A1  May 14, 2020

Related U.S. Application Data

(62) Division of application No. 16/028,763, filed on Jul. 6, 2018, now Pat. No. 10,535,636.

(Continued)

(51) Int. Cl.
*H01L 25/065* (2006.01)
*H01L 25/03* (2006.01)
(Continued)

(52) U.S. Cl.
CPC ...... *H01L 25/0657* (2013.01); *H01L 23/5389* (2013.01); *H01L 23/552* (2013.01);
(Continued)

(58) Field of Classification Search
CPC ..... H01L 23/481; H01L 23/5226–5227; H01L 23/5383–5389; H01L 25/03–04;
(Continued)

(56) References Cited

U.S. PATENT DOCUMENTS 6,242,298 B1 * 6/2001 Kawakubo ........ H01L 21/31691
438/239
6,982,487 B2  1/2006 Kim et al.
(Continued)

FOREIGN PATENT DOCUMENTS

CN  101404281 A  4/2009
CN  103187394 A  7/2013
(Continued)

*Primary Examiner* — Maliheh Malek
(74) *Attorney, Agent, or Firm* — Slater Matsil, LLP

(57) ABSTRACT

A method includes bonding a first device die with a second device die. The second device die is over the first device die. A passive device is formed in a combined structure including the first and the second device dies. The passive device includes a first and a second end. A gap-filling material is formed over the first device die, with the gap-filling material including portions on opposite sides of the second device die. The method further includes performing a planarization to reveal the second device die, with a remaining portion of the gap-filling material forming an isolation region, forming a first and a second through-vias penetrating through the isolation region to electrically couple to the first device die, and forming a first and a second electrical connectors electrically coupling to the first end and the second end of the passive device.

20 Claims, 19 Drawing Sheets

Related U.S. Application Data

(60) Provisional application No. 62/586,333, filed on Nov. 15, 2017.

(51) Int. Cl.
  *H01L 25/18* (2006.01)
  *H01L 23/552* (2006.01)
  *H01L 23/538* (2006.01)
  *H01L 23/00* (2006.01)
  *H01L 25/00* (2006.01)

(52) U.S. Cl.
  CPC .............. *H01L 24/08* (2013.01); *H01L 24/19* (2013.01); *H01L 24/80* (2013.01); *H01L 24/94* (2013.01); *H01L 25/03* (2013.01); *H01L 25/50* (2013.01); *H01L 25/18* (2013.01); *H01L 2224/04105* (2013.01); *H01L 2224/08145* (2013.01); *H01L 2224/12105* (2013.01); *H01L 2224/16227* (2013.01); *H01L 2224/73259* (2013.01); *H01L 2224/80895* (2013.01); *H01L 2224/92224* (2013.01); *H01L 2224/94* (2013.01); *H01L 2225/0651* (2013.01); *H01L 2225/06513* (2013.01); *H01L 2225/06524* (2013.01); *H01L 2225/06537* (2013.01); *H01L 2225/06541* (2013.01); *H01L 2225/06548* (2013.01); *H01L 2225/06558* (2013.01); *H01L 2225/06568* (2013.01); *H01L 2225/06582* (2013.01); *H01L 2225/1023* (2013.01); *H01L 2225/1035* (2013.01); *H01L 2225/1058* (2013.01); *H01L 2924/15311* (2013.01); *H01L 2924/18161* (2013.01); *H01L 2924/18162* (2013.01); *H01L 2924/19041* (2013.01); *H01L 2924/19042* (2013.01); *H01L 2924/19104* (2013.01); *H01L 2924/3025* (2013.01)

(58) Field of Classification Search
  CPC ... H01L 25/043; H01L 25/0657; H01L 25/18; H01L 25/50; H01L 2924/15; H01L 2924/15311; H01L 2924/1816–18165; H01L 2225/06503; H01L 2225/06541; H01L 2225/06544; H01L 2225/06548; H01L 2225/06558; H01L 2225/06562; H01L 2225/06565; H01L 2225/06582; H01L 2225/06586
  See application file for complete search history.

(56) References Cited

U.S. PATENT DOCUMENTS

| | | | |
|---|---|---|---|
| 7,808,090 B2 * | 10/2010 | Shionoiri | G06K 19/07779 257/679 |
| 8,492,872 B2 | 7/2013 | Yang et al. | |
| 8,884,416 B2 * | 11/2014 | Lee | H01L 24/73 257/686 |
| 8,952,526 B2 | 2/2015 | Lin et al. | |
| 9,040,381 B2 | 5/2015 | Yu et al. | |
| 9,202,716 B2 | 12/2015 | Park et al. | |
| 9,355,936 B2 | 5/2016 | Cooney, III et al. | |
| 9,478,508 B1 * | 10/2016 | LaRoche | H01L 23/5226 |
| 9,627,365 B1 * | 4/2017 | Yu | H01L 23/5389 |
| 9,881,894 B2 | 1/2018 | Pendse | |
| 10,535,636 B2 * | 1/2020 | Hu | H01L 23/5385 |
| 10,950,599 B1 * | 3/2021 | Or-Bach | H01L 27/0688 |
| 11,075,145 B2 * | 7/2021 | Yu | H01L 25/18 |
| 2004/0132322 A1 | 7/2004 | Brandenburg | H05K 1/0233 439/75 |
| 2007/0029646 A1 * | 2/2007 | Voldman | H01L 24/05 257/662 |
| 2008/0246126 A1 | 10/2008 | Bowles et al. | |
| 2010/0109136 A1 * | 5/2010 | Yamada | H01L 24/48 257/676 |
| 2010/0123995 A1 * | 5/2010 | Otsuka | H01G 4/232 361/308.1 |
| 2010/0219502 A1 | 9/2010 | Shieh et al. | |
| 2010/0232131 A1 * | 9/2010 | Qian | H01L 24/49 361/813 |
| 2011/0193221 A1 * | 8/2011 | Hu | H01L 23/49827 257/737 |
| 2011/0193235 A1 * | 8/2011 | Hu | H01L 23/5389 257/773 |
| 2012/0074521 A1 * | 3/2012 | Imanaka | B82Y 30/00 257/532 |
| 2012/0187530 A1 | 7/2012 | Zhang et al. | |
| 2013/0037965 A1 * | 2/2013 | Morimoto | H01L 23/5223 257/774 |
| 2014/0185264 A1 * | 7/2014 | Chen | H01L 25/0652 361/814 |
| 2014/0264519 A1 * | 9/2014 | Totani | H01L 24/40 257/299 |
| 2015/0115389 A1 * | 4/2015 | Chuang | H01L 23/481 257/460 |
| 2015/0280785 A1 * | 10/2015 | Brauchler | H04B 5/0018 257/531 |
| 2015/0318246 A1 * | 11/2015 | Yu | H01L 25/065 257/774 |
| 2015/0318263 A1 * | 11/2015 | Yu | H01L 24/92 257/774 |
| 2015/0325520 A1 * | 11/2015 | Yu | H01L 25/065 257/774 |
| 2016/0020235 A1 | 1/2016 | Yamashita | |
| 2016/0071820 A1 * | 3/2016 | Yu | H01L 21/6836 257/737 |
| 2016/0155724 A1 * | 6/2016 | Kim | H01L 24/94 257/48 |
| 2016/0358966 A1 * | 12/2016 | Borthakur | H01L 27/14685 |
| 2017/0053849 A1 * | 2/2017 | Lin | H01L 21/4882 |
| 2017/0053902 A1 * | 2/2017 | Yu | H01L 25/105 |
| 2017/0103969 A1 * | 4/2017 | Krause | H01L 25/065 |
| 2017/0194292 A1 * | 7/2017 | Yu | H01L 21/78 |
| 2017/0200756 A1 * | 7/2017 | Kao | H01L 23/481 |
| 2017/0301650 A1 * | 10/2017 | Yu | H01L 24/92 |
| 2017/0345761 A1 * | 11/2017 | Yu | H01L 21/4857 |
| 2018/0005940 A1 * | 1/2018 | Chen | H01L 24/09 |
| 2018/0025992 A1 * | 1/2018 | Hung | H01L 21/6835 257/668 |
| 2018/0033773 A1 * | 2/2018 | Huang | H01L 25/50 |
| 2018/0033817 A1 * | 2/2018 | Ho | H01L 25/0657 |
| 2018/0082964 A1 * | 3/2018 | Wu | H01L 23/5386 |
| 2018/0082978 A1 * | 3/2018 | Yu | H01L 24/19 |
| 2018/0323177 A1 * | 11/2018 | Yu | H01L 24/09 |
| 2018/0366437 A1 * | 12/2018 | Chen | H01L 24/19 |
| 2018/0374822 A1 * | 12/2018 | Yu | H01L 24/73 |
| 2019/0088581 A1 * | 3/2019 | Yu | H01L 24/03 |
| 2019/0148336 A1 * | 5/2019 | Chen | H01L 24/05 257/774 |
| 2019/0148342 A1 * | 5/2019 | Hu | H01L 25/03 257/659 |
| 2019/0148351 A1 * | 5/2019 | Chen | H01L 24/09 257/678 |
| 2019/0244947 A1 * | 8/2019 | Yu | H01L 24/08 |
| 2019/0333871 A1 * | 10/2019 | Chen | H01L 21/78 |
| 2019/0355637 A1 * | 11/2019 | Chen | H01L 23/3135 |
| 2020/0006309 A1 * | 1/2020 | Chen | H01L 23/5389 |
| 2020/0105653 A1 * | 4/2020 | Elsherbini | H01L 23/642 |
| 2020/0161263 A1 * | 5/2020 | Chen | H01L 25/50 |
| 2020/0273839 A1 * | 8/2020 | Elsherbini | H01L 25/50 |
| 2020/0381397 A1 * | 12/2020 | Yu | H01L 25/0657 |
| 2020/0402960 A1 * | 12/2020 | Chen | H01L 25/50 |
| 2021/0005594 A1 * | 1/2021 | Yu | H01L 21/6835 |
| 2021/0028151 A1 * | 1/2021 | Li | H01L 24/94 |

(56) References Cited

U.S. PATENT DOCUMENTS

2021/0057332 A1* 2/2021 Chen .................. H01L 23/5226
2021/0066222 A1* 3/2021 Chen ................ H01L 21/76879

FOREIGN PATENT DOCUMENTS

| EP | 3032578 A1 | 6/2016 |
| TW | 201232723 A | 8/2012 |
| TW | 201347053 A | 11/2013 |
| WO | 97208675 A1 | 8/1997 |
| WO | 2013066455 A2 | 5/2013 |

* cited by examiner

INTEGRATING PASSIVE DEVICES IN PACKAGE STRUCTURES

PRIORITY CLAIM AND CROSS-REFERENCE

This application is a divisional of U.S. patent application Ser. No. 16/028,763, entitled "Integrating Passive Devices in Package Structures," filed on Jul. 6, 2018, which claims the benefit of the Provisional Application No. 62/586,333, filed Nov. 15, 2017, and entitled "Integrating Passive Devices in SoIC Structures;" which applications are hereby incorporated herein by reference.

BACKGROUND

The packages of integrated circuits are becoming increasing complex, with more device dies packaged in the same package to achieve more functions. For example, a package structure has been developed to include a plurality of device dies such as processors and memory cubes in the same package. The package structure can include device dies formed using different technologies and have different functions bonded to the same device die, thus forming a system. This may save manufacturing cost and optimize device performance.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
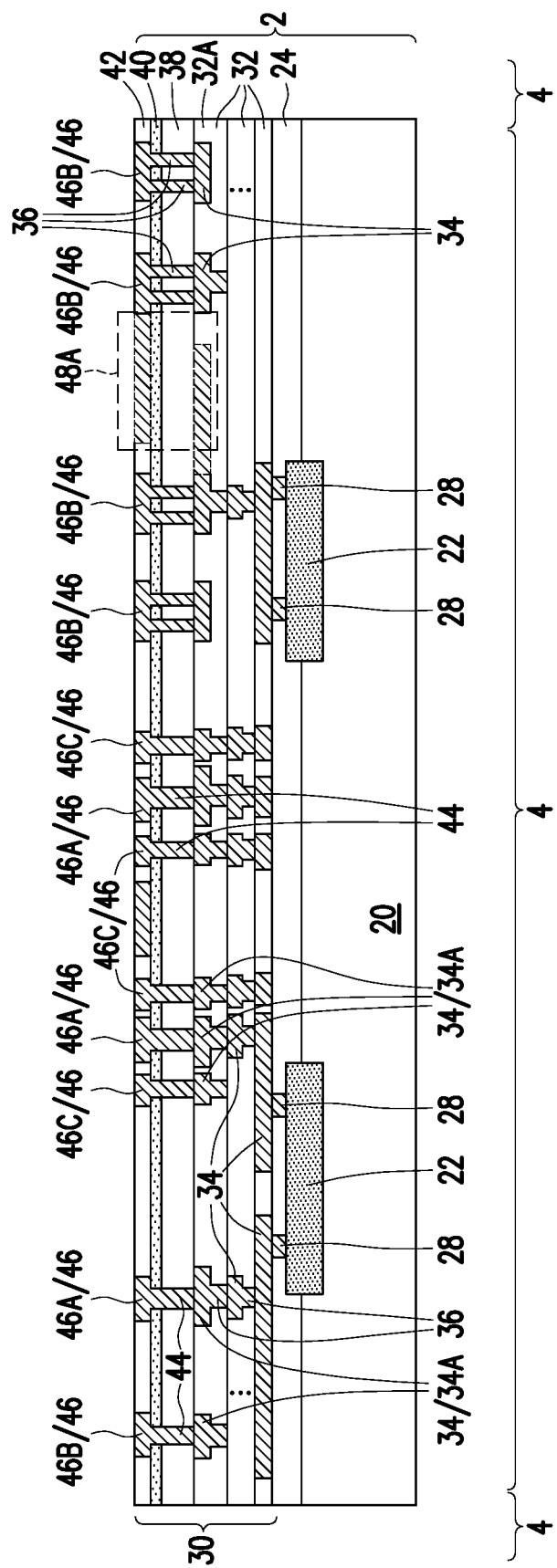
FIGS. 1 through 10 are cross-sectional views of intermediate stages in the manufacturing of a package in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A package and the method of forming the same are provided in accordance with various exemplary embodiments. The intermediate stages of forming the package are illustrated in accordance with some embodiments. Some variations of some embodiments are discussed. Throughout the various views and illustrative embodiments, like reference numbers are used to designate like elements.

Figure 21:
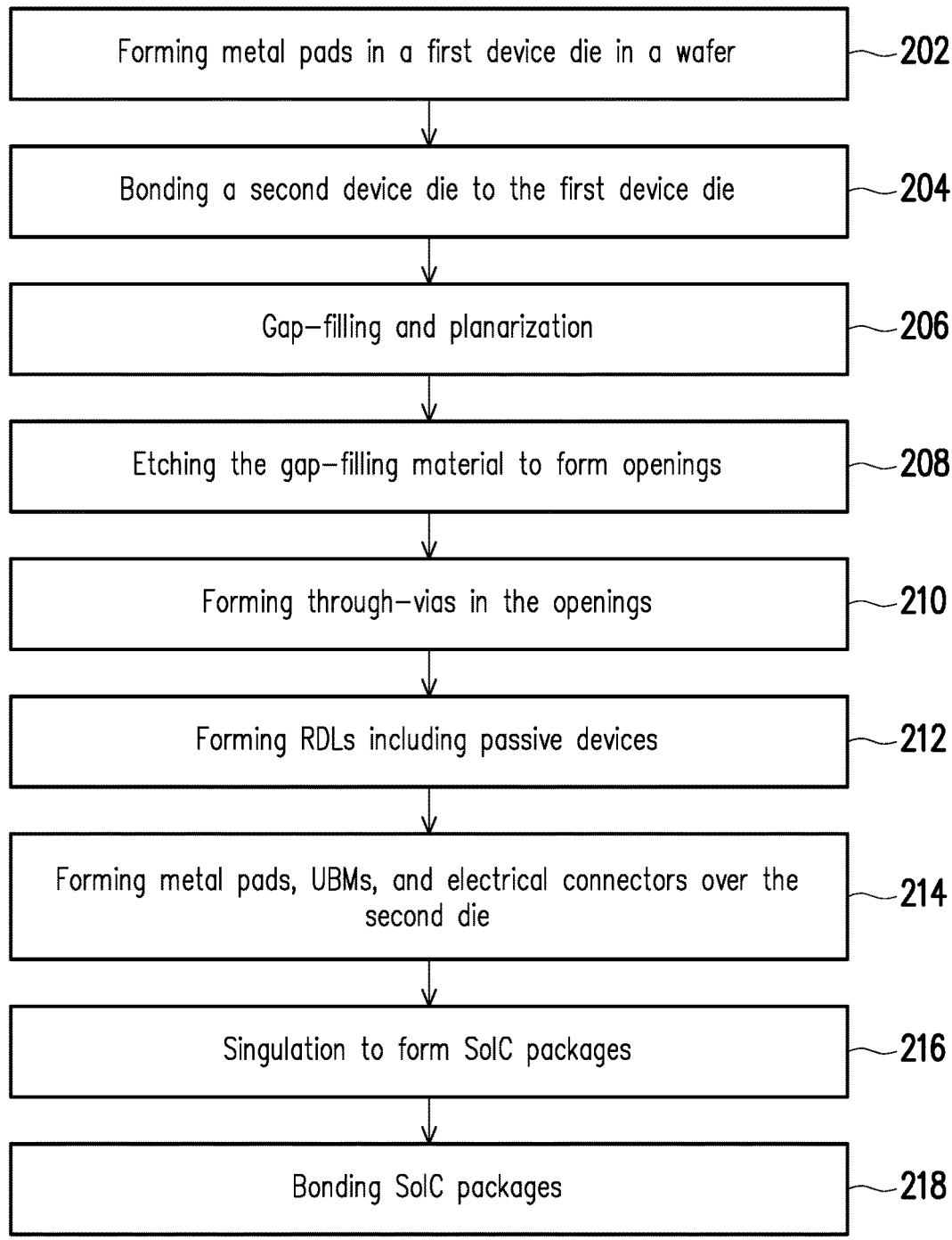
FIG. 21 illustrates a process flow for forming a package in accordance with some embodiments.

FIGS. 1 through 10 illustrate the cross-sectional views of intermediate stages in the formation of a package in accordance with some embodiments of the present disclosure. The steps shown in FIGS. 1 through 10 are also reflected schematically in the process flow 200 shown in FIG. 21.

FIG. 1 illustrates the cross-sectional view in the formation of package component 2. In accordance with some embodiments of the present disclosure, package component 2 is a device wafer including active devices 22 such as transistors and/or diodes, and possibly passive devices such as capacitors, inductors, resistors, or the like. Package component 2 may include a plurality of chips 4 therein, with one of chips 4 illustrated. Chips 4 are alternatively referred to as (device) dies hereinafter. In accordance with some embodiments of the present disclosure, device die 4 is a logic die, which may be a Central Processing Unit (CPU) die, a Micro Control Unit (MCU) die, an input-output (IO) die, a BaseBand (BB) die, an Application processor (AP) die, or the like. Device die 4 may also be a memory die such as a Dynamic Random Access Memory (DRAM) die or a Static Random Access Memory (SRAM) die, or may be other types of dies. In subsequent discussion, a device wafer is discussed as an exemplary package component 2. The embodiments of the present disclosure may also be applied to other types of package components such as interposer wafers.

In accordance with some embodiments of the present disclosure, the exemplary wafer 2 includes semiconductor substrate 20 and the features formed at a top surface of semiconductor substrate 20. Semiconductor substrate 20 may be formed of crystalline silicon, crystalline germanium, crystalline silicon germanium, and/or a III-V compound semiconductor such as GaAsP, AlInAs, AlGaAs, GaInAs, GaInP, GaInAsP, or the like. Semiconductor substrate 20 may also be a bulk silicon substrate or a Silicon-On-Insulator (SOI) substrate. Shallow Trench Isolation (STI) regions (not shown) may be formed in semiconductor substrate 20 to isolate the active regions in semiconductor substrate 20. Although not shown, through-vias may be formed to extend into semiconductor substrate 20, and the through-vias are used to electrically inter-couple the features on opposite sides of wafer 2.

In accordance with some embodiments of the present disclosure, wafer 2 includes integrated circuit devices 22, which are formed on the top surface of semiconductor substrate 20. Exemplary integrated circuit devices 22 may include Complementary Metal-Oxide Semiconductor (CMOS) transistors, resistors, capacitors, diodes, and/or the like. The details of integrated circuit devices 22 are not illustrated herein. In accordance with alternative embodiments, wafer 2 is used for forming interposers, in which substrate 20 may be a semiconductor substrate or a dielectric substrate.

Inter-Layer Dielectric (ILD) 24 is formed over semiconductor substrate 20, and fills the space between the gate stacks of transistors (not shown) in integrated circuit devices 22. In accordance with some exemplary embodiments, ILD 24 is formed of Phospho Silicate Glass (PSG), Boro Silicate Glass (BSG), Boron-Doped Phospho Silicate Glass (BPSG), Fluorine-Doped Silicate Glass (FSG), Tetra Ethyl Ortho Silicate (TEOS), or the like. ILD 24 may be formed using spin coating, Flowable Chemical Vapor Deposition (FCVD), Chemical Vapor Deposition (CVD), Plasma Enhanced Chemical Vapor Deposition (PECVD), Low Pressure Chemical Vapor Deposition (LPCVD), or the like.

Contact plugs 28 are formed in ILD 24, and are used to electrically connect integrated circuit devices 22 to overlying metal lines 34 and vias 36. In accordance with some embodiments of the present disclosure, contact plugs 28 are formed of a conductive material selected from tungsten, aluminum, copper, titanium, tantalum, titanium nitride, tantalum nitride, alloys therefore, and/or multi-layers thereof. The formation of contact plugs 28 may include forming contact openings in ILD 24, filling a conductive material(s) into the contact openings, and performing a planarization (such as Chemical Mechanical Polish (CMP) process) to level the top surfaces of contact plugs 28 with the top surface of ILD 24.

Over ILD 24 and contact plugs 28 resides interconnect structure 30. Interconnect structure 30 includes dielectric layers 32, and metal lines 34 and vias 36 formed in dielectric layers 32. Dielectric layers 32 are alternatively referred to as Inter-Metal Dielectric (IMD) layers 32 hereinafter. In accordance with some embodiments of the present disclosure, at least a lower layer in dielectric layers 32 is formed of a low-k dielectric material having a dielectric constant (k-value) lower than about 3.0 or lower than about 2.5. Dielectric layers 32 may be formed of Black Diamond (a registered trademark of Applied Materials), a carbon-containing low-k dielectric material, Hydrogen SilsesQuioxane (HSQ), MethylSilsesQuioxane (MSQ), or the like. In accordance with alternative embodiments of the present disclosure, some or all of dielectric layers 32 are formed of non-low-k dielectric materials such as silicon oxide, silicon carbide (SiC), silicon carbo-nitride (SiCN), silicon oxy-carbo-nitride (SiOCN), or the like. In accordance with some embodiments of the present disclosure, the formation of dielectric layers 32 includes depositing a porogen-containing dielectric material, and then performing a curing process to drive out the porogen, and hence the remaining dielectric layers 32 becomes porous. Etch stop layers (not shown), which may be formed of silicon carbide, silicon nitride, or the like, are formed between IMD layers 32, and are not shown for simplicity.

Metal lines (also include metal pads) 34 and vias 36 are formed in dielectric layers 32. The metal lines 34 at a same level are collectively referred to as a metal layer hereinafter. In accordance with some embodiments of the present disclosure, interconnect structure 30 includes a plurality of metal layers that are interconnected through vias 36. Metal lines 34 and vias 36 may be formed of copper or copper alloys, and they can also be formed of other metals. The formation process may include single damascene and dual damascene processes. In an exemplary single damascene process, a trench is first formed in one of dielectric layers 32, followed by filling the trench with a conductive material. A planarization process such as a CMP process is then performed to remove the excess portions of the conductive material higher than the top surface of the IMD layer, leaving a metal line in the trench. In a dual damascene process, both a trench and a via opening are formed in an IMD layer, with the via opening underlying and connected to the trench. The conductive material is then filled into the trench and the via opening to form a metal line and a via, respectively. The conductive material may include a diffusion barrier and a copper-containing metallic material over the diffusion barrier. The diffusion barrier may include titanium, titanium nitride, tantalum, tantalum nitride, or the like.

Metal lines 34 include metal lines 34A, which are sometimes referred to as top metal lines. Top metal lines 34A are also collectively referred to as being a top metal layer. The respective dielectric layer 32A may be formed of a non-low-k dielectric material such as Un-doped Silicate Glass (USG), silicon oxide, silicon nitride, or the like. Dielectric layer 32A may also be formed of a low-k dielectric material, which may be selected from the similar materials of the underlying IMD layers 32.

In accordance with some embodiments of the present disclosure, dielectric layers 38, 40, and 42 are formed over the top metal layer. Dielectric layers 38 and 42 may be formed of silicon oxide, silicon oxynitride, silicon oxycarbide, or the like, Dielectric layer 40 is formed of a dielectric material different from the dielectric material of dielectric layer 42. For example, dielectric layer 42 may be formed of silicon nitride, silicon carbide, or the like.

Vias 44 and metal pads 46A, 46B, and 46C are formed in dielectric layers 38, 40, and 42. The respective process is illustrated as step 202 in the process flow shown in FIG. 21. Metal pads 46A, 46B, and 46C may be collectively and individually referred to as metal pads 46 hereinafter. Vias 44 and metal pads 46 may be formed using a dual damascene process, which includes forming via openings in dielectric layers 38 and 40, trenches in dielectric layer 42, and filling the via openings and trenches with conductive materials. A planarization process such as a CMP process or a mechanical grinding process is performed to level the top surfaces of dielectric layer 42 and metal pads 46. The filling of the conductive materials may include depositing a diffusion barrier such as a titanium nitride layer, a tantalum nitride layer, a titanium layer, a tantalum layer, or the like, and depositing a copper-containing material over the diffusion barrier.

Device die 4 may also include metal pads such as aluminum or aluminum copper pads, which may be formed in dielectric layer 38 in accordance with some embodiments. The aluminum (copper) pads are not shown for simplicity.

In accordance with some embodiments of the present disclosure, there is no organic dielectric material such as polymer layer in wafer 2. Organic dielectric layers typically have high Coefficients of Thermal Expansion (CTEs), which may be 10 ppm/C° or higher. This is significantly greater than the CTE of silicon substrate (such as substrate 20), which is about 3 ppm/C°. Accordingly, organic dielectric layers tend to cause the warpage of wafer 2. Not including organic materials in wafer 2 advantageously reduces the CTE mismatch between the layers in wafer 2, and results in the reduction in warpage. Also, not including organic materials in wafer 2 makes the formation of fine-pitch metal lines (such as 66 and 70 in FIG. 10) and high-density bond pads possible, and results in the improvement in the routing ability.

Figure 14:
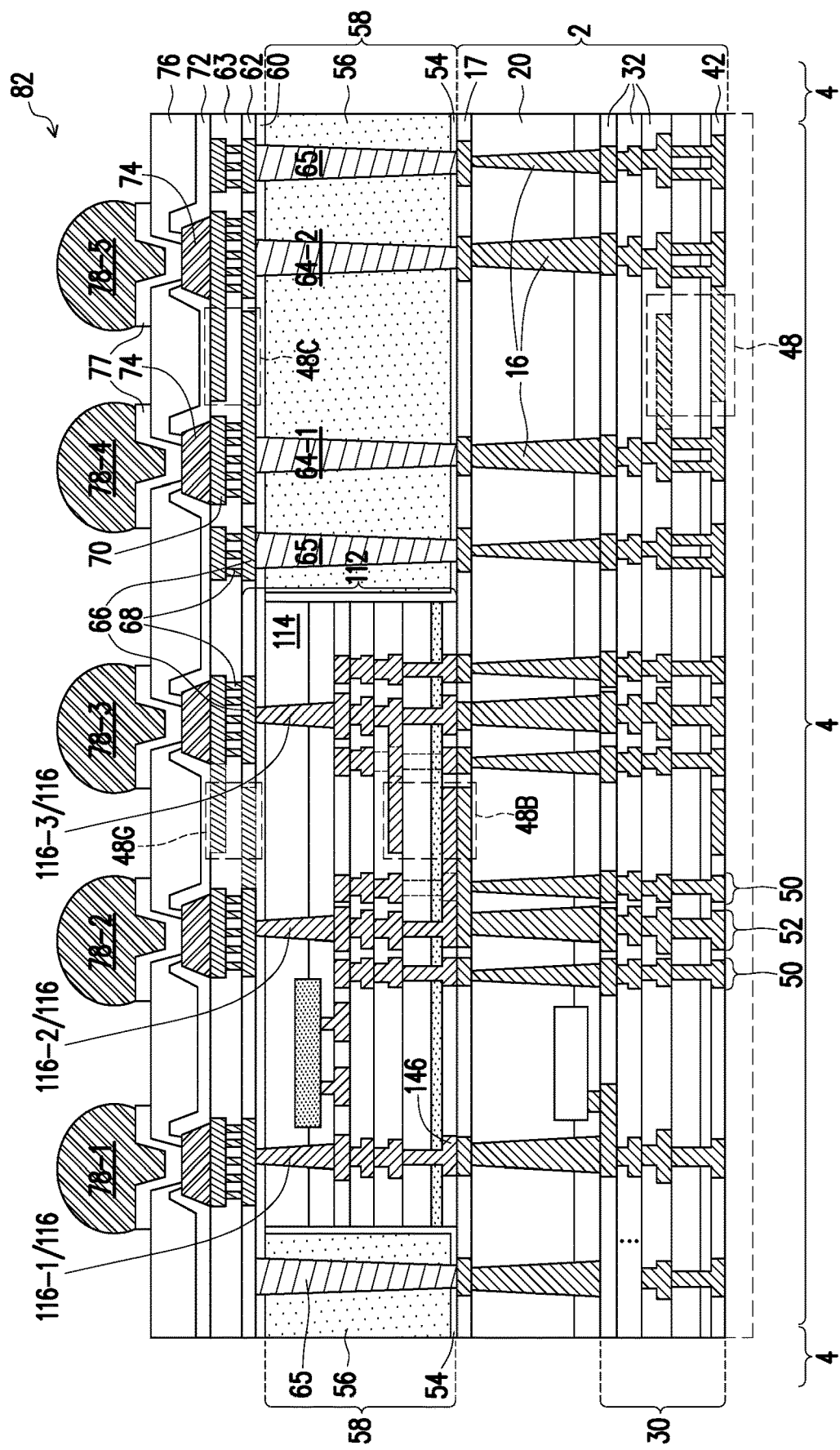
FIG. 14 illustrates the cross-sectional view of a package having device dies bonded through face-to-back bonding in accordance with some embodiments.
Figure 15:
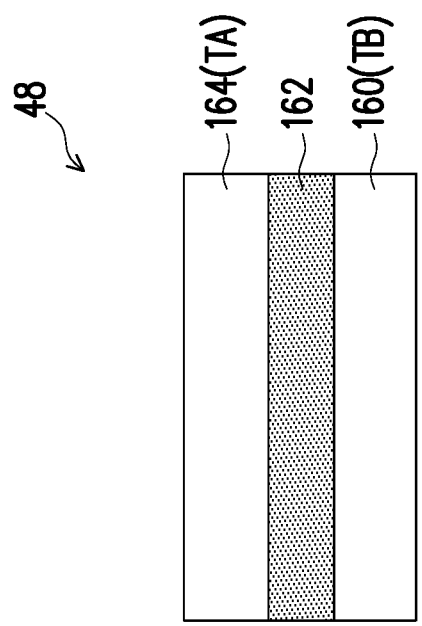

FIG. 1 also illustrates the formation of passive device 48A, which is formed simultaneously with the formation of the top metal layer and metal pads 46. Throughout the description, passive devices may be identified as 48A, 48B, 48C, 48D, 48E, 48F, 48G (shown in FIGS. 10 through 14), or the like, which may be collectively and individually referred to as passive devices 48. In accordance with some embodiments of the present disclosure, passive device 48A (and any other passive device 48) may be a capacitor, an inductor, a transformer, a resistor, or the like. FIG. 15 illustrates an exemplary passive device 48, which is a capacitor. Capacitor 48 includes capacitor plates 160 and 164 and capacitor insulator 162. Capacitor plates 160 and 164 are also referred to as the two terminals TB and TA, respectively, of capacitor 48. When capacitor 48A (FIG. 1) is a capacitor having the structure shown in FIG. 15, the top capacitor plate 164 is formed simultaneously as metal pads 46 (FIG. 1), the bottom capacitor plate 160 is formed simultaneously as top metal layer 34A (FIG. 1), and the capacitor insulator is a part of dielectric layers 38 and 40.

Figure 16:
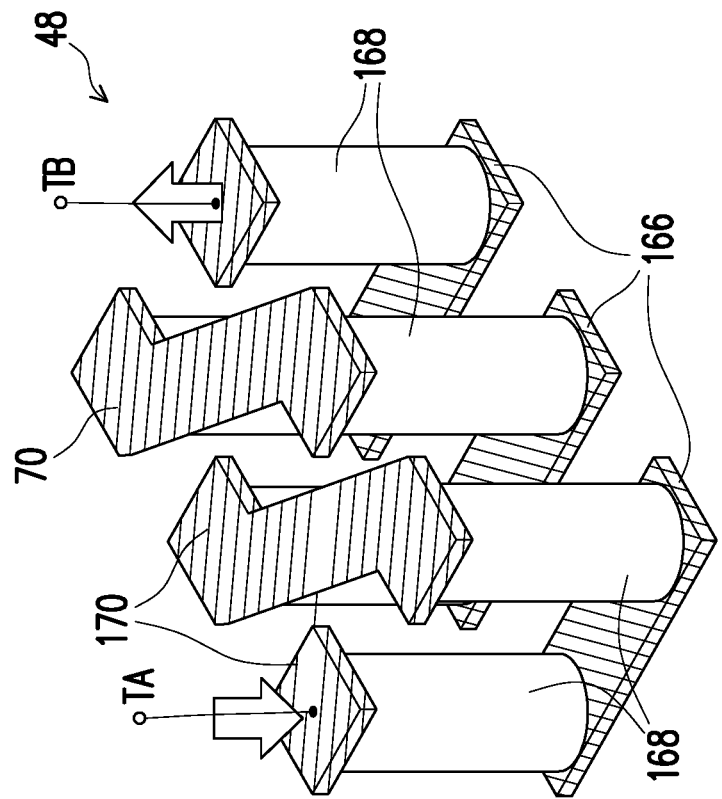
FIGS. 15 and 16 illustrate exemplary passive devices in accordance with some embodiments.

FIG. 16 illustrates an exemplary passive device 48, which is an inductor. The inductor may include bottom plates 166, top plates 170, and vias 168. Vias 168 interconnect bottom plates 166 and top plate 170 to form the inductor. When capacitor 48A (FIG. 1) is an inductor having the structure shown in FIG. 16, the top plates 170 are formed simultaneously as metal pads 46, the bottom plates 166 are formed simultaneously as top metal layer 34A, and vias 168 (FIG. 16) are formed simultaneously as vias 44 (FIG. 1). Passive device 48 in FIG. 16 also has two terminals TA and TB. Throughout the description, more passive devices may be formed, and the exemplary structures and the corresponding layers may be found by referring to FIGS. 15 and 16 as examples. It is appreciated that the passive devices may have many different structures than what are shown in FIGS. 15 and 16.

Figure 2:
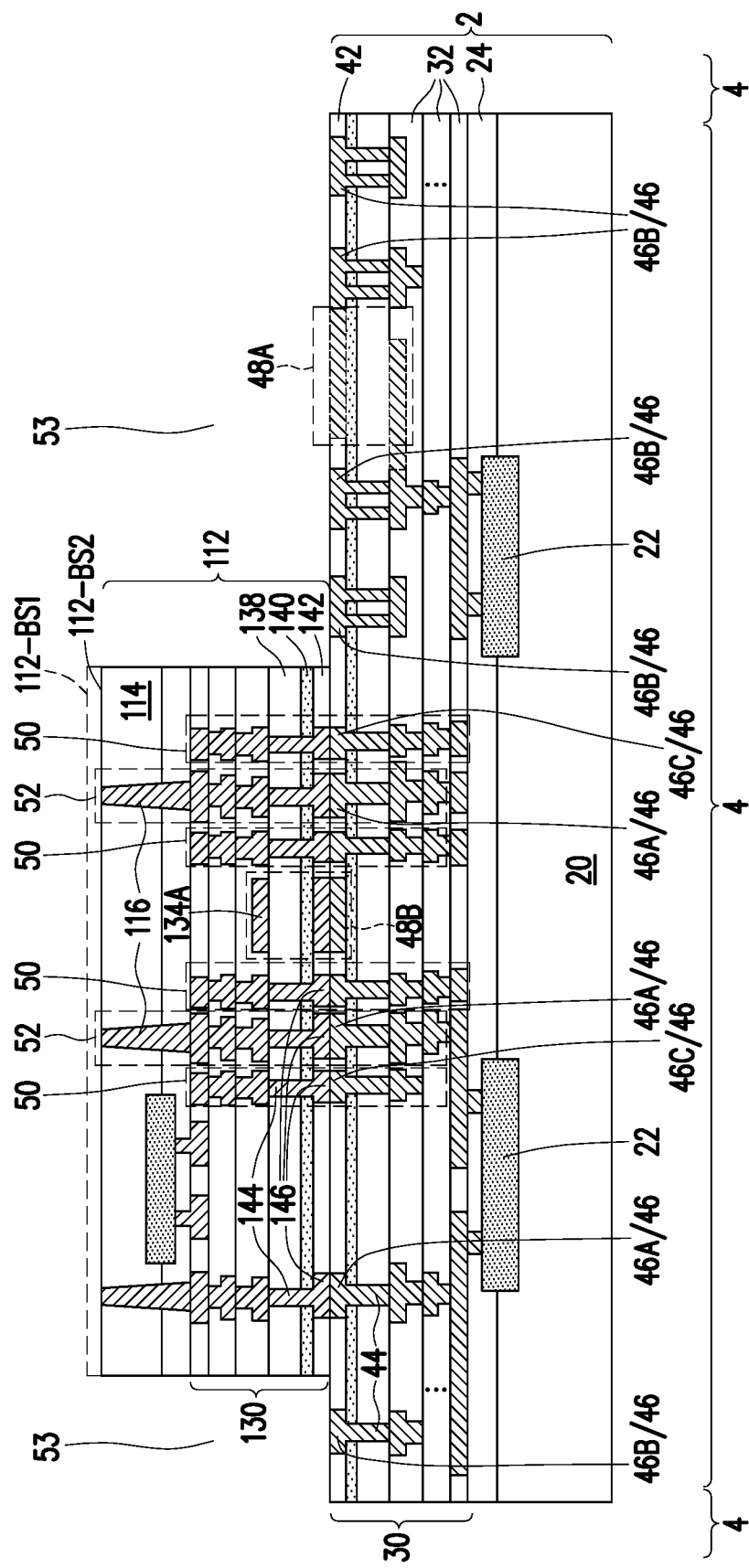

FIG. 2 illustrates the bonding of device die 112 to device die 4. The respective process is illustrated as step 204 in the process flow shown in FIG. 21. In accordance with some embodiments of the present disclosure, device die 112 is a logic die, which may be a CPU die, a MCU die, an IO die, a BaseBand die, an AP die, or the like. Device dies 112 may also be a memory die. Device die 110 includes semiconductor substrate 114, which may be a silicon substrate. Through-Silicon Vias (TSVs) 116, sometimes referred to as through-semiconductor vias or through-vias, are formed to penetrate through semiconductor substrate 114. TSVs 116 are used to connect the devices and metal lines formed on the front side (the illustrated bottom side) of semiconductor substrate 114 to the backside. Also, device dies 112 include interconnect structures 130 for connecting to the active devices and passive devices in device dies 112. Interconnect structures 130 include metal lines and vias (not shown).

Device die 112 may include dielectric layers 138 and 142, and etch stop layer 140 between dielectric layers 138 and 142. Bond pads 146 and vias 144 are formed in layers 138, 140, and 142. In accordance with some embodiments of the present disclosure, die 112 is free from organic dielectric materials such as polymers. The materials and the formation methods of dielectric layers 138 and 142, bond pads 146, and vias 144 may be similar to their corresponding parts in device die 4, and hence the details are not repeated herein.

The bonding of device die 112 to die 4 may be achieved through hybrid bonding. For example, bond pads 146 are bonded to bond pads 46A and 46C through metal-to-metal direct bonding. In accordance with some embodiments of the present disclosure, the metal-to-metal direct bonding is copper-to-copper direct bonding. Bond pads 146 may have sizes greater than, equal to, or smaller than, the sizes of the respective bond pads 46A and 46C. Although one device die 112 is illustrated, there may be a plurality of device dies 112 bonding to wafer 2, and gaps 53 are left between neighboring device dies 112. Furthermore, dielectric layers 142 are bonded to surface dielectric layer 42 through dielectric-to-dielectric bonding, which may be fusion bonding, for example, with Si—O—Si bonds generated. To achieve the hybrid bonding, device die 112 is first pre-bonded to dielectric layer 42 and bond pads 46A by lightly pressing device die 112 against die 4. An anneal is then performed to incur the inter-diffusion of the metals in bond pads 46A/46C and the corresponding overlying bond pads 146.

Referring back to FIG. 2, in accordance with some embodiments, after the bonding process, a backside grinding may be performed to thin device dies 112, for example, to a thickness between about 15 μm and about 30 μm. FIG. 2 schematically illustrates dashed line 112-BS1, which is the back surface of device die 112 before the backside grinding. Back surface 112-BS2 is the back surface of device die 112 after the backside grinding. Through the thinning of device die 112, the aspect ratio of gaps 53 is reduced in order to perform gap filling. Otherwise, the gap filling may be difficult due to the otherwise high aspect ratio of gaps 53. After the backside grinding, TSVs 116 may be revealed. Alternatively, TSVs 116 are not revealed at this time, and the backside grinding is stopped when there is a thin layer of substrate 114 covering TSVs 116. In accordance with these embodiments, TSVs 116 may be revealed in the step shown in FIG. 4. In accordance with other embodiments in which the aspect ratio of gaps 53 is not too high for gap filling, the backside grinding is skipped.

In accordance with some embodiments of the present disclosure, device die 112 includes a portion of passive device 48B. After the bonding of device die 112 and device die 4, a metal pad(s) of device die 4 is bonded to the portion of passive device 48B in device die 112 to form the entire passive device 48B. For example, when passive device 48B is a capacitor, the top capacitor plate may be a part of top metal layer 134A. The bottom capacitor plate includes an upper portion and a bottom portion, which are the metal pads of device dies 112 and 4, respectively. When passive device 48B is an inductor, for example, as shown in FIG. 16, the top plates 170 (FIG. 16) will be in the top metal layer 134A (FIG. 2) in device die 112, the vias 168 (FIG. 16) will be in dielectric layers 138 and 140 (FIG. 2) in device die 112, and each of the bottom plates 166 (FIG. 16) will also include an upper portion and a bottom portion, which are the metal pads of device dies 112 and 4, respectively.

Figure 10:
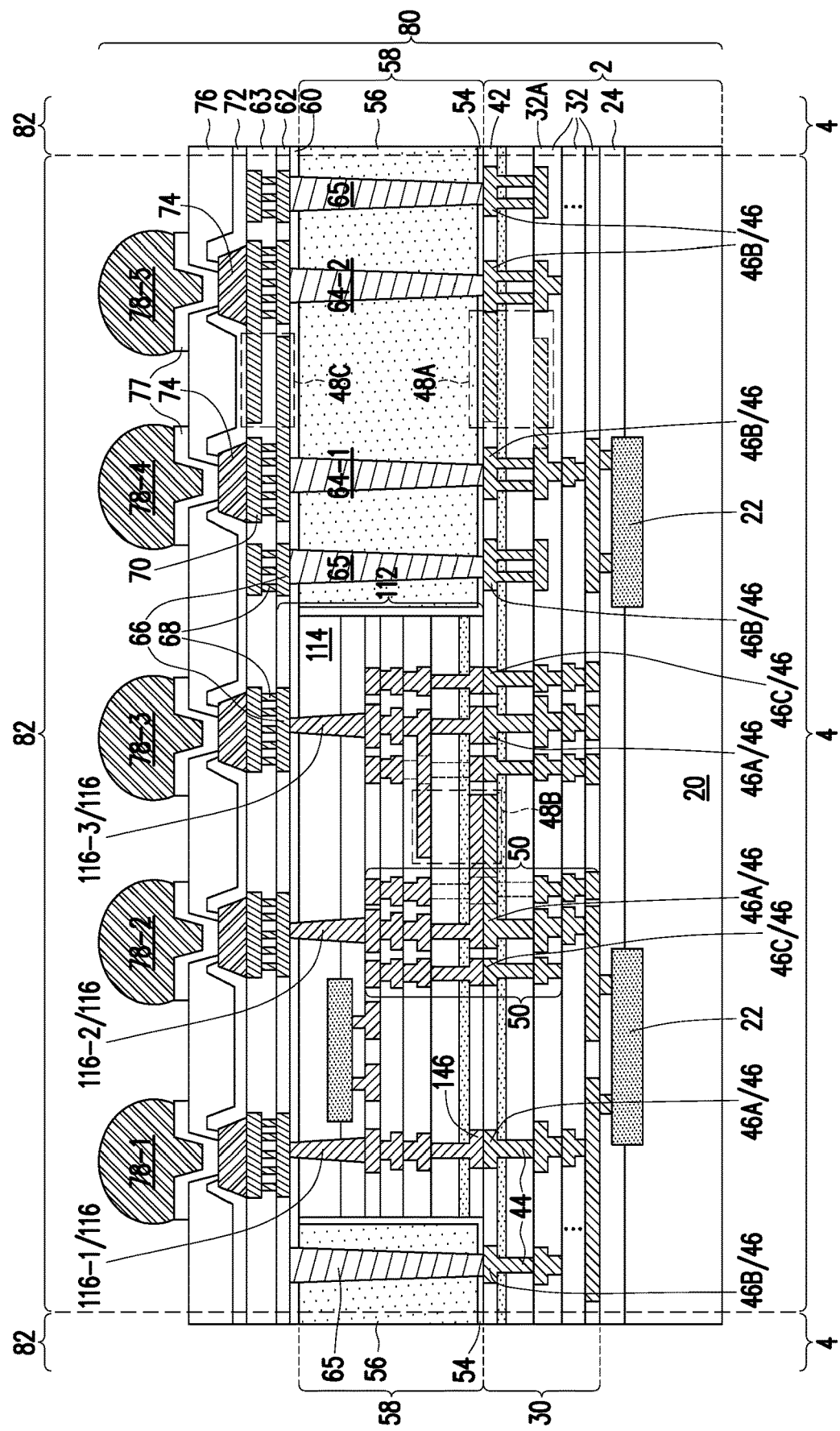

After the bonding of device die 112 to device die 4, electrical connection channels 52 are formed, each including stacked metal pads/lines and vias, so that the passive devices 48 that are formed in device dies 112 and 4 may be connected to the overlying electrical connectors (such as solder regions) that will be formed in subsequent steps. Shielding rings 50 are formed, each encircling one of the electrical channels 52. When viewed from the top of the structure shown in FIG. 2, shielding rings 50 have the shape of rings. Shielding rings 50 are formed of metal lines and vias, which may be solid rings (without breaks) in some metal layers and some via layers. In order to electrically connect to passive devices, shielding rings 50 have some breaks allowing metal lines to pass through the breaks to connect passive devices 48 to electrical channels 52. The metal lines that connect to the passive devices 48 are electrically insulated from shielding rings by dielectric materials. For example, FIG. 10 illustrates a cross-sectional view obtained from a plane in which the metal lines pass through the breaks in shielding rings 50 to interconnect passive device 48B and electrical connection channels 52. The dashed lines (which show parts of shielding rings 50) in FIG. 10 represent the parts of shielding rings in front of and behind the illustrated plane. Shielding rings 50 are electrically grounded, so that the passive device (such as 48B) does not interfere, and is not interfered by, other devices in device dies 112 and 4.

Figure 3:
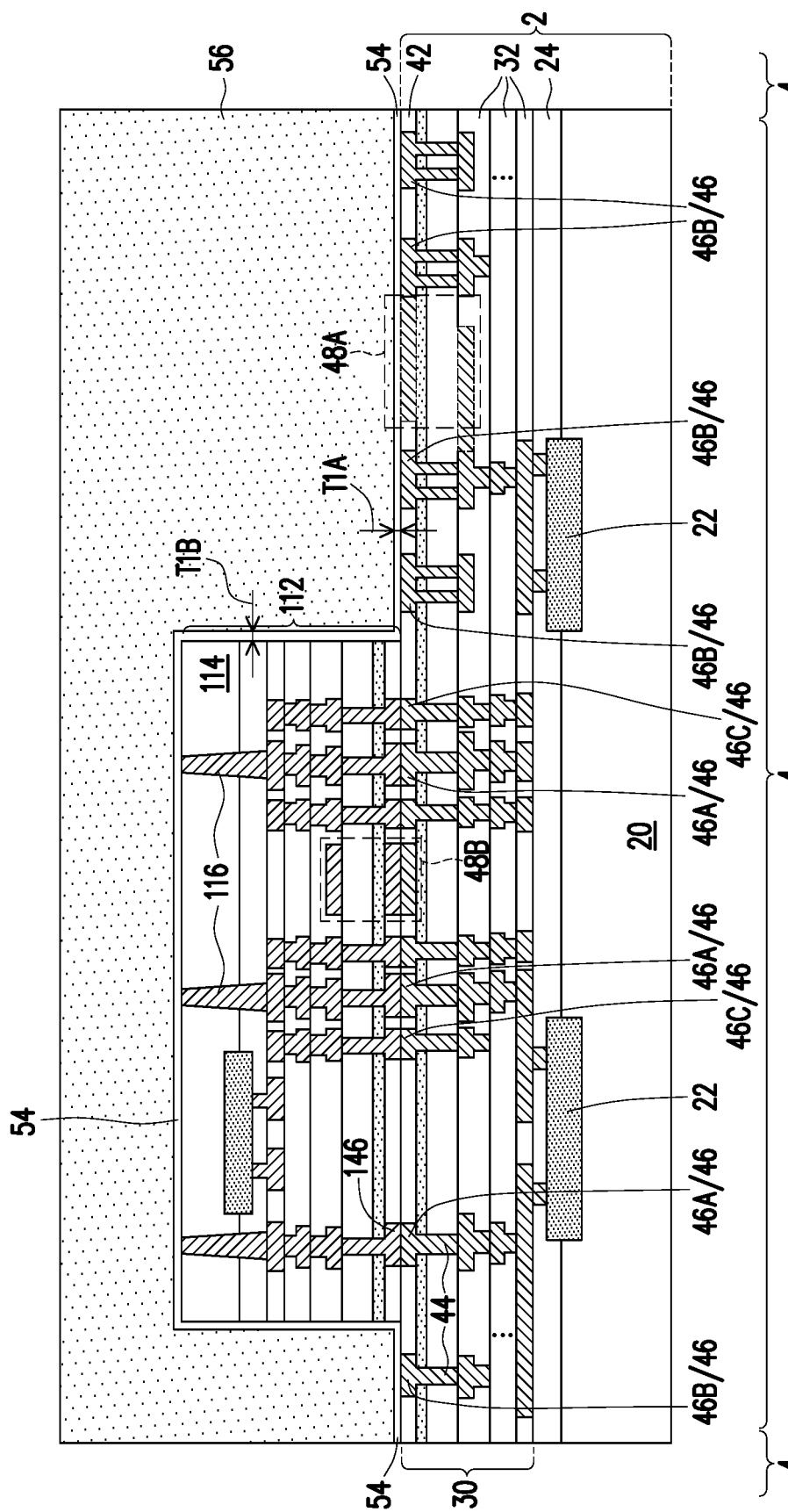

FIG. 3 illustrates the formation of gap-filling layers, which includes dielectric layer 56 and the underlying etch stop layer 54. The respective process is illustrated as step 206 in the process flow shown in FIG. 21. Dielectric layer 54 may be deposited using a conformal deposition method such as Atomic Layer Deposition (ALD) or Chemical Vapor Deposition (CVD). Etch stop layer 54 is formed of a dielectric material that has a good adhesion to the sidewalls of device dies 112, the top surfaces of dielectric layer 42, and bond pads 46B. In accordance with some embodiments of the present disclosure, etch stop layer 54 is formed of a nitride-containing material such as silicon nitride. Etch stop layer 54 may be a conformal layer, with the thickness T1A of the horizontal portions and thickness T1B of the vertical portions being substantially equal to each other, for example, with the difference (T1A-T1B) having an absolute value smaller than about 20 percent, or smaller than about 10 percent, of both thicknesses T1A and T1B.

Dielectric layer 56 is formed of a material different from the material of etch stop layer 54. In accordance with some embodiments of the present disclosure, dielectric layer 56 is formed of silicon oxide, which may be formed of TEOS, while other dielectric materials such as silicon carbide, silicon oxynitride, silicon oxy-carbo-nitride, PSG, BSG, BPSG, or the like may also be used. Dielectric layer 56 may be formed using CVD, High-Density Plasma Chemical Vapor Deposition (HDPCVD), Flowable CVD, spin-on coating, or the like. Dielectric layer 56 fully fills the remaining gaps 53 (FIG. 2).

Figure 4:
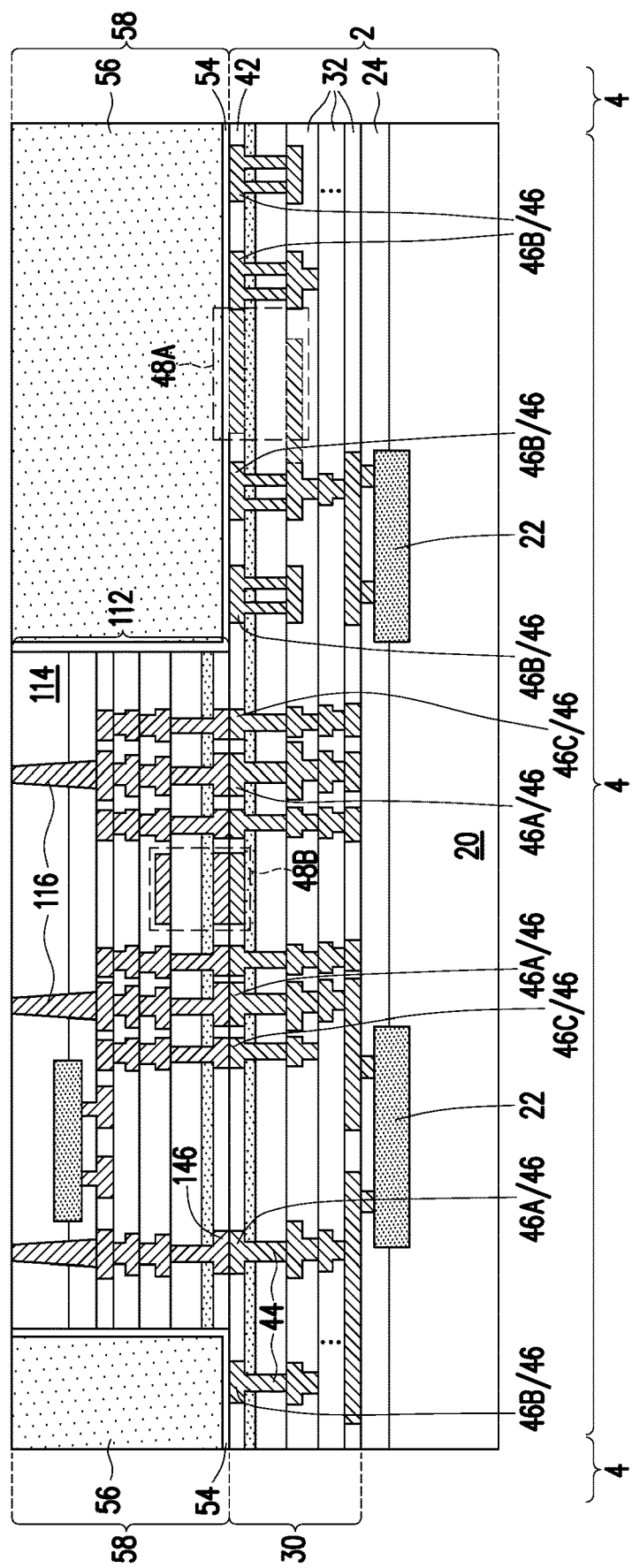

Referring to FIG. 4, a planarization process such as a CMP process or a mechanical grinding process is performed to remove excess portions of gap-filling layers 54 and 56, so that device die 112 is exposed. The respective process is also illustrated as step 206 in the process flow shown in FIG. 21. Also, through-vias 116 are exposed. The remaining portions of layers 54 and 56 are collectively referred to as (gap-filling) isolation regions 58.

Figure 5:
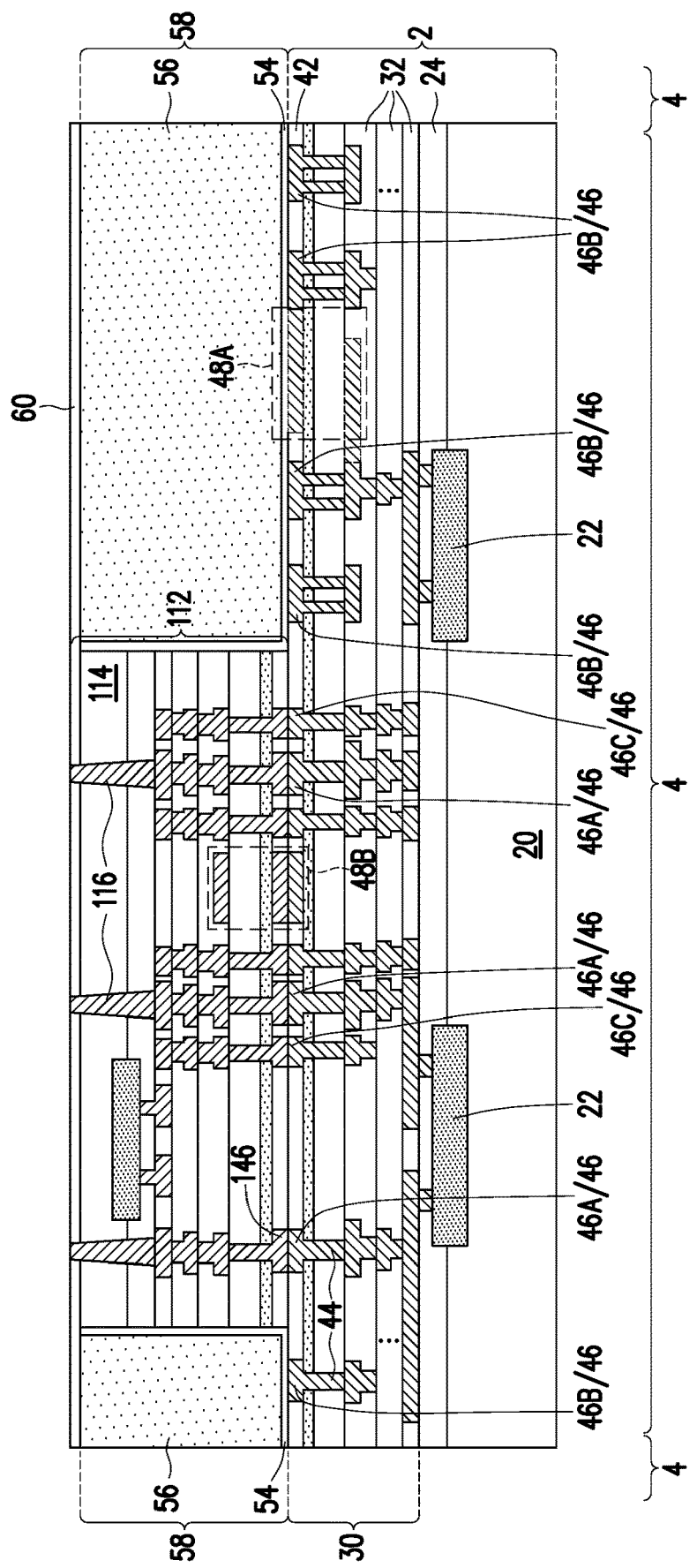

In accordance with some embodiments of the present disclosure, as shown in FIG. 5, substrate 114 is lightly etched, so that through-vias 116 has a top portion protruding out of the top surfaces of substrate 114. Dielectric layer 60 is formed, and is lightly polished to remove the portions of dielectric layer 60 covering through-vias 116. Dielectric layer 60 may be formed of silicon oxide, silicon nitride, silicon oxynitride, or the like. In accordance with some embodiments of the present disclosure, the etching of through-vias 116 and the formation of dielectric layer 60 are skipped.

Figure 6:
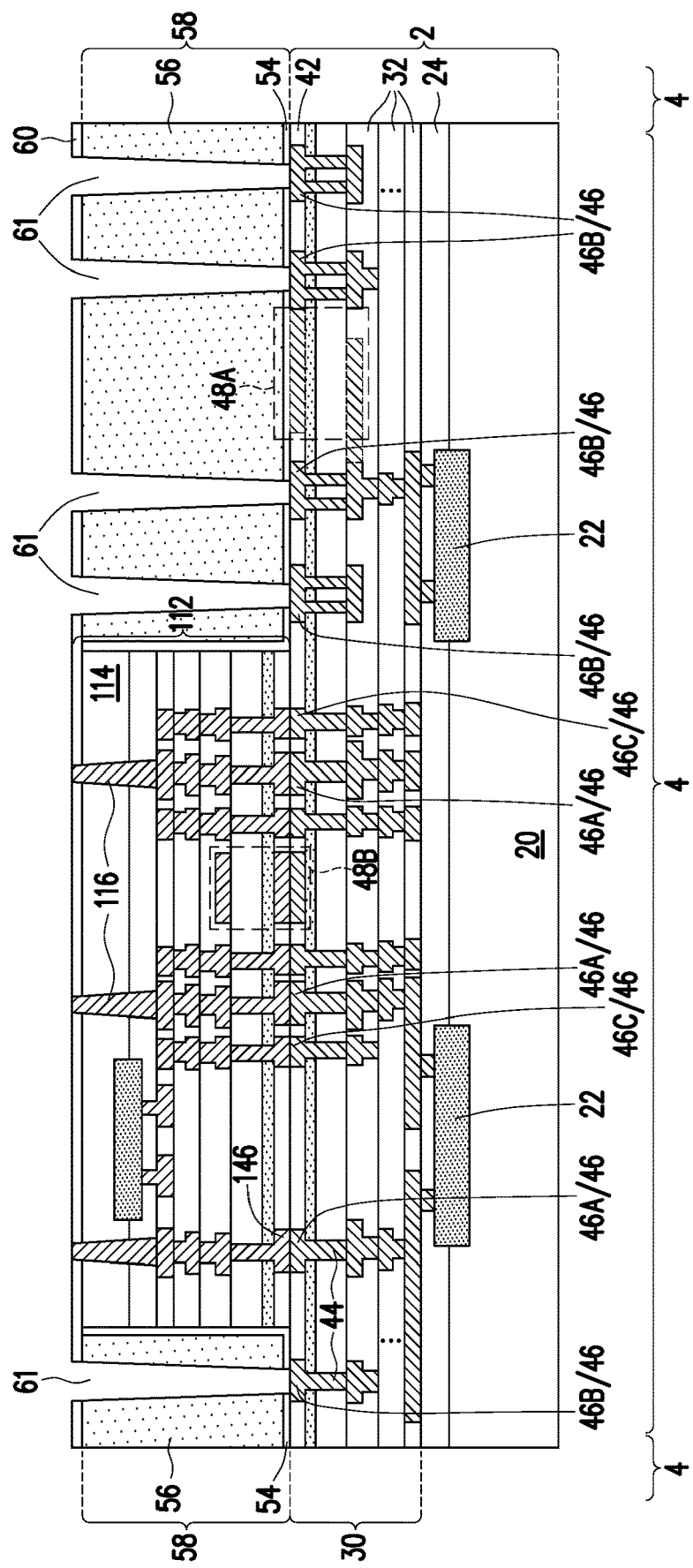

FIG. 6 illustrates the etching of dielectric layers 60, 56, and 54 to form openings 61. The respective process is illustrated as step 208 in the process flow shown in FIG. 21. In accordance with some embodiments of the present disclosure, a photo resist (not shown) is formed and patterned, and dielectric layers 60 and 56 are etched using the patterned photo resist as an etching mask. Openings 61 are thus formed, and extend down to etch stop layer 54, which acts as the etch stop layer. In accordance with some embodiments of the present disclosure, layers 60 and 56 comprise an oxide, and the etching may be performed through dry etching. The etching gas may include a mixture of $NF_3$ and $NH_3$, or a mixture of HF and $NH_3$. Next, etch stop layer 54 is etched, so that openings 61 extend down to bond pads 46B. In accordance with some embodiments of the present disclosure, etch stop layer 54 is formed of silicon nitride, and the etching is performed using dry etching. The etching gas may include a mixture of $CF_4$, $O_2$, and $N_2$, a mixture of $NF_3$ and $O_2$, $SF_6$, a mixture of $SF_6$ and $O_2$, or the like.

Figure 7:
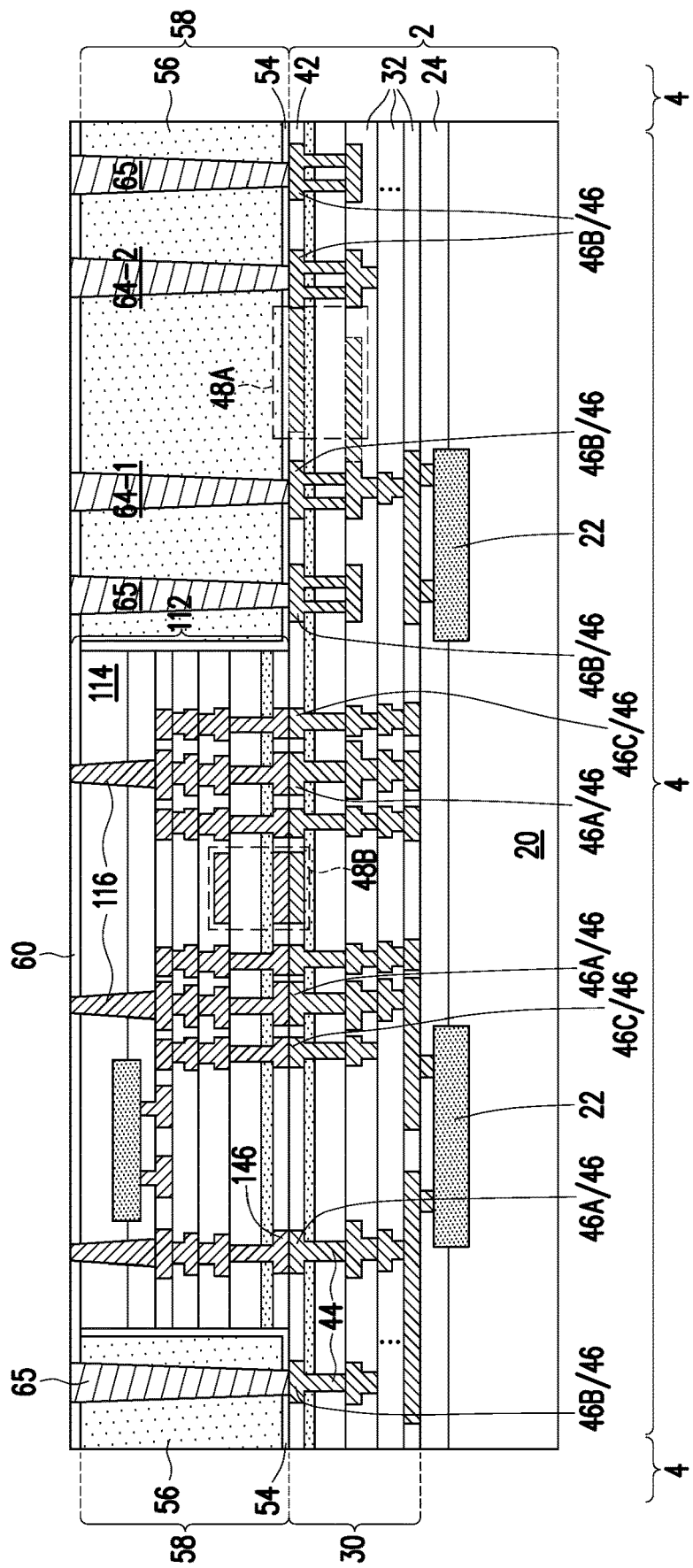

FIG. 7 illustrates the formation of through-vias 64 (including 64-1 and 64-2) and Through-Dielectric Via (TDV) 65, which fills openings 61 (FIG. 6). The respective process is illustrated as step 210 in the process flow shown in FIG. 21. Through-vias 64 and TDVs 65 are connected to bond pads 46B. TDVs 65 are electrically grounded to form a shielding structure, so that the passive device (such as 48C in FIG. 10) does not interfere, and is not electrically interfered by, other devices in device dies 112 and 4. In accordance with some embodiments of the present disclosure, the formation of through-vias 64 and TDVs 65 includes performing a plating process such as an electrical-chemical plating process or an electro-less plating process. Through-vias 64 and TDVs 65 may include a metallic material such as tungsten, aluminum, copper, or the like. A conductive barrier layer (such as titanium, titanium nitride, tantalum, tantalum nitride, or the like) may also be formed underlying the metallic material. A planarization such as a CMP is performed to remove excess portions of the plated metallic material, and the remaining portions of the metallic material form through-vias 64 and TDVs 65. Through-vias 64 and TDVs 65 may have substantially straight and vertical sidewalls. Also, through-vias 64 and TDVs 65 may have a tapered profile, with top widths slightly greater than the respective bottom widths.

In accordance with alternative embodiments, TSVs 116 are not pre-formed in device dies 112. Rather, they are formed after the formation of isolation regions 58. For example, either before or after the formation of openings 61 (FIG. 6), device dies 112 are etched to form additional openings (occupied by the illustrated TSVs 116). The additional openings in device dies 112 and openings 61 may be filled simultaneously to form through TSVs 116 and through-vias 64. The resulting through-vias 116 may have upper portions wider than the respective lower portions, opposite to what are shown in FIG. 10.

Figure 8:
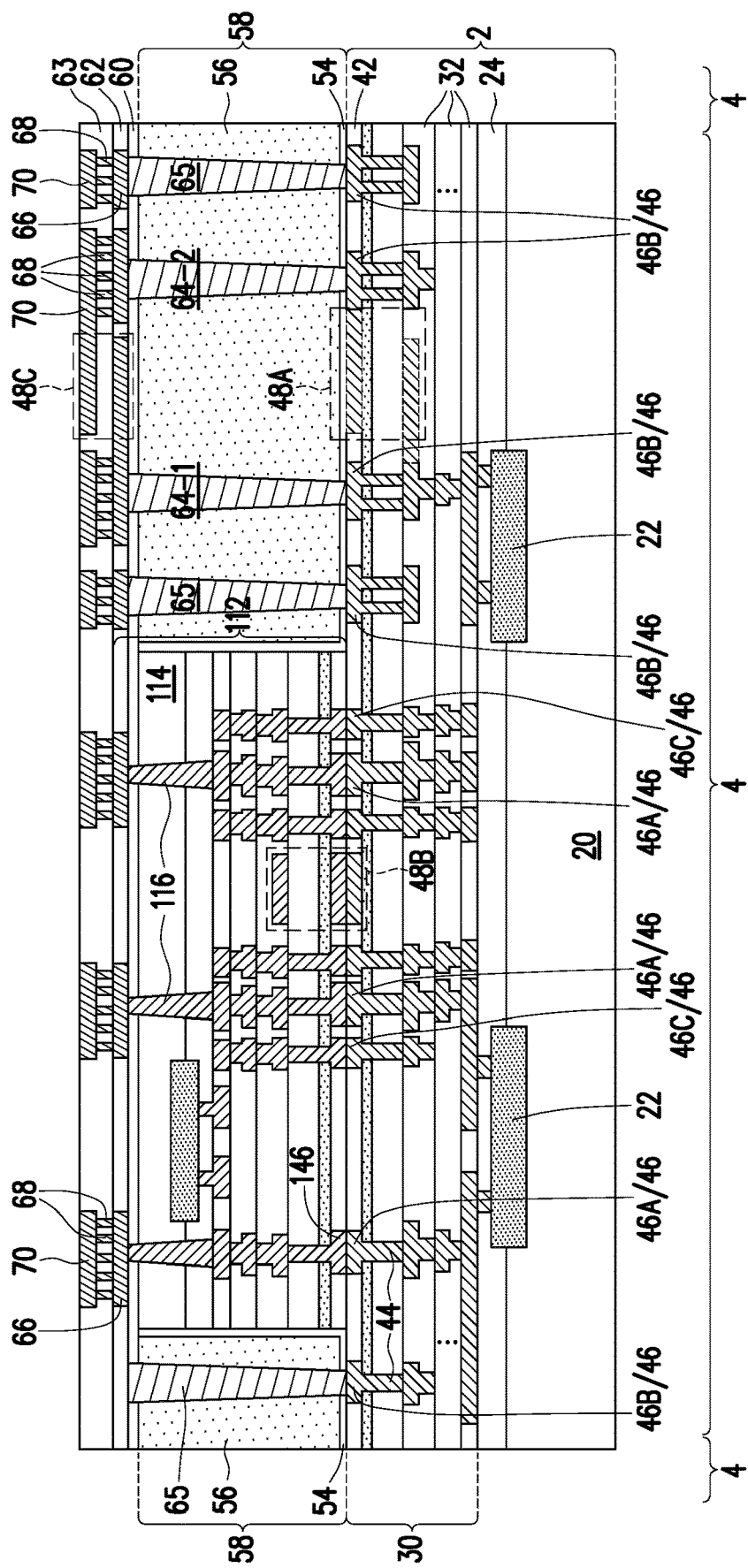

Referring to FIG. 8, dielectric layers 62 and 63, Redistribution Lines (RDLs) 66 and 70, and vias 68 are formed. The respective process is illustrated as step 212 in the process flow shown in FIG. 21. In accordance with some embodiments of the present disclosure, dielectric layers 62 and 63 are formed of an oxide such as silicon oxide, a nitride such as silicon nitride, or the like. Although two RDL layers are illustrated, there may be more than two layers of RDLs. RDLs 70 may be formed using single and/or dual damascene processes, which include etching the dielectric layers to form via openings and trenches, depositing a conductive barrier layer into the openings, plating a metallic material such as copper or a copper alloy, and performing a planarization to remove the excess portions of the metallic material. There may be etch stop layers between dielectric layers 60, 62, and 63, which etch stop layers are not shown.

FIG. 8 illustrates passive device 48C, which may also be a capacitor, an inductor, or the like, as illustrated in some exemplary embodiments in FIGS. 15 and 16. Passive device 48C is formed simultaneously with the formation of other redistribution lines.

Figure 9:
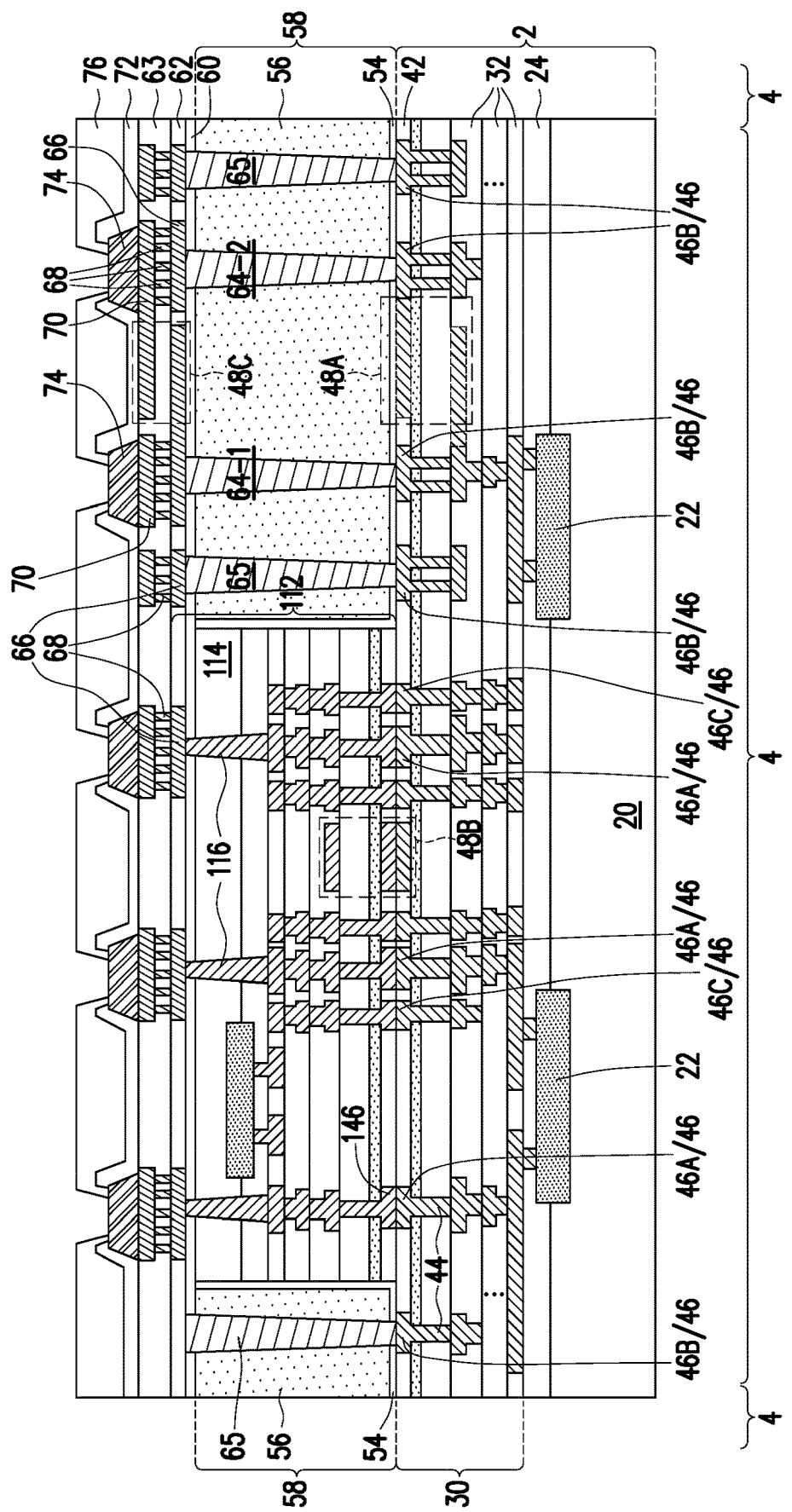

FIG. 9 illustrates the formation of passivation layers, metal pads, and overlying dielectric layers. The respective process is illustrated as step 214 in the process flow shown in FIG. 21. Passivation layer 72 is formed over dielectric layer 63. Metal pads 74 are formed over passivation layer 72, and are electrically coupled to RDLs 70. Metal pads 74 may be aluminum pads or aluminum-copper pads, and other metallic materials may be used. In accordance with some embodiments of the present disclosure, metal pads 74 are not formed, and Post-Passivation Interconnects (PPIs) are formed. Passivation layer 72 may be a single layer or a composite layer, and may be formed of a non-porous material. In accordance with some embodiments of the present disclosure, passivation layer 72 is a composite layer including a silicon oxide layer (not shown separately), and a silicon nitride layer (not shown separately) over the silicon oxide layer. Passivation layer 72 may also be formed of other non-porous dielectric materials such as Un-doped Silicate Glass (USG), silicon oxynitride, and/or the like. Next, polymer layer 76 is formed, and then patterned to expose Metal pads 74. Polymer layer 76 may be formed of polyimide, polybenzoxazole (PBO), or the like.

In accordance with some embodiments of the present disclosure, the structure underlying Metal pads 74 is free from organic materials (such as polymer layers), so that the process for forming the structures underlying Metal pads 74 may adopt the process used for forming device dies, and fine-pitches RDLs (such as 66 and 70) having small pitches and line widths are made possible.

Referring to 10, Under-Bump Metallurgies (UBMs) 77 are formed, and UBMs 77 extend into polymer layer 76 to connect to metal pads 74 or PPIs. The respective process is illustrated as step 214 in the process flow shown in FIG. 21. In accordance with some embodiments of the present disclosure, each of UBMs 77 includes a barrier layer (not shown) and a seed layer (not shown) over the barrier layer. The barrier layer may be a titanium layer, a titanium nitride layer, a tantalum layer, a tantalum nitride layer, or a layer formed of a titanium alloy or a tantalum alloy. The materials of the seed layer may include copper or a copper alloy. Other metals such as silver, gold, aluminum, palladium, nickel, nickel alloys, tungsten alloys, chromium, chromium alloys, and combinations thereof may also be included in UBMs 77.

As also shown in FIG. 10, electrical connectors 78 (including 78-1 through 78-5) are formed. The respective process is also illustrated as step 214 in the process flow shown in FIG. 21. An exemplary formation process for forming UBMs 77 and electrical connectors 78 includes depositing a blanket UBM layer, forming and patterning a mask (which may be a photo resist, not shown), with portions of the blanket UBM layer being exposed through the openings in the mask. After the formation of UBMs 77, the illustrated package is placed into a plating solution (not shown), and a plating step is performed to form electrical connectors 78 on UBMs 77. In accordance with some exemplary embodiments of the present disclosure, electrical connectors 78 include non-solder parts (not shown), which are not molten in the subsequent reflow processes. The non-solder parts may be formed of copper, and hence are referred to as copper bumps hereinafter, although they may be formed of other non-solder materials. Each of electrical connectors 78 may also include cap layer(s) (not shown) selected from a nickel layer, a nickel alloy, a palladium layer, a gold layer, a silver layer, or multi-layers thereof. The cap layer(s) are formed over the copper bumps. Electrical connectors 78 may further include solder caps. The structure formed in preceding steps is referred to as composite wafer 80. A die-saw (singulation) step is performed on composite wafer 80 to separate composite wafer 80 into a plurality of packages 82. The respective process is illustrated as step 216 in the process flow shown in FIG. 21.

Figure 11:
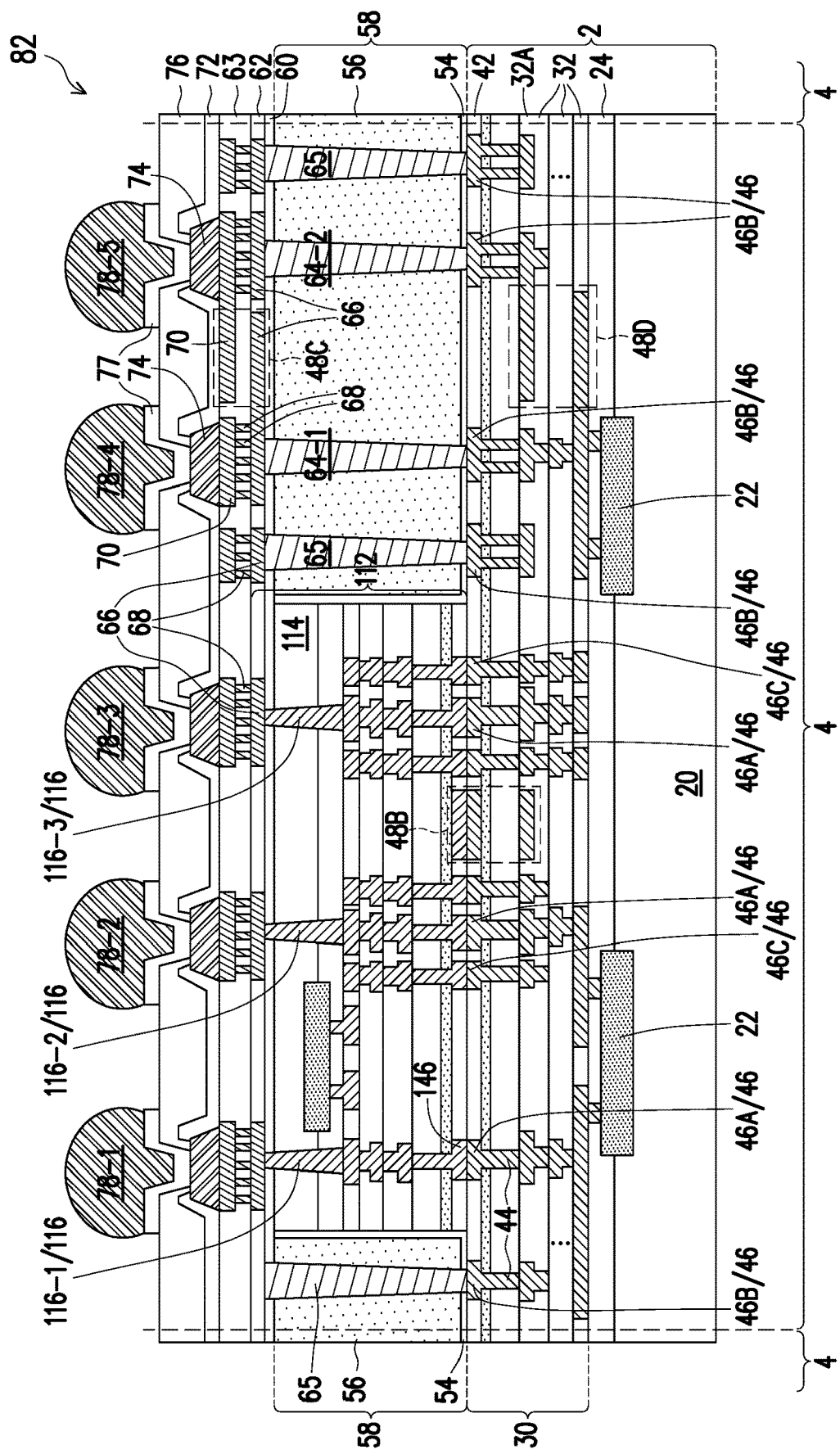
FIGS. 11 through 13 illustrate the cross-sectional views of packages having device dies bonded through face-to-face bonding in accordance with some embodiments.
Figure 12:
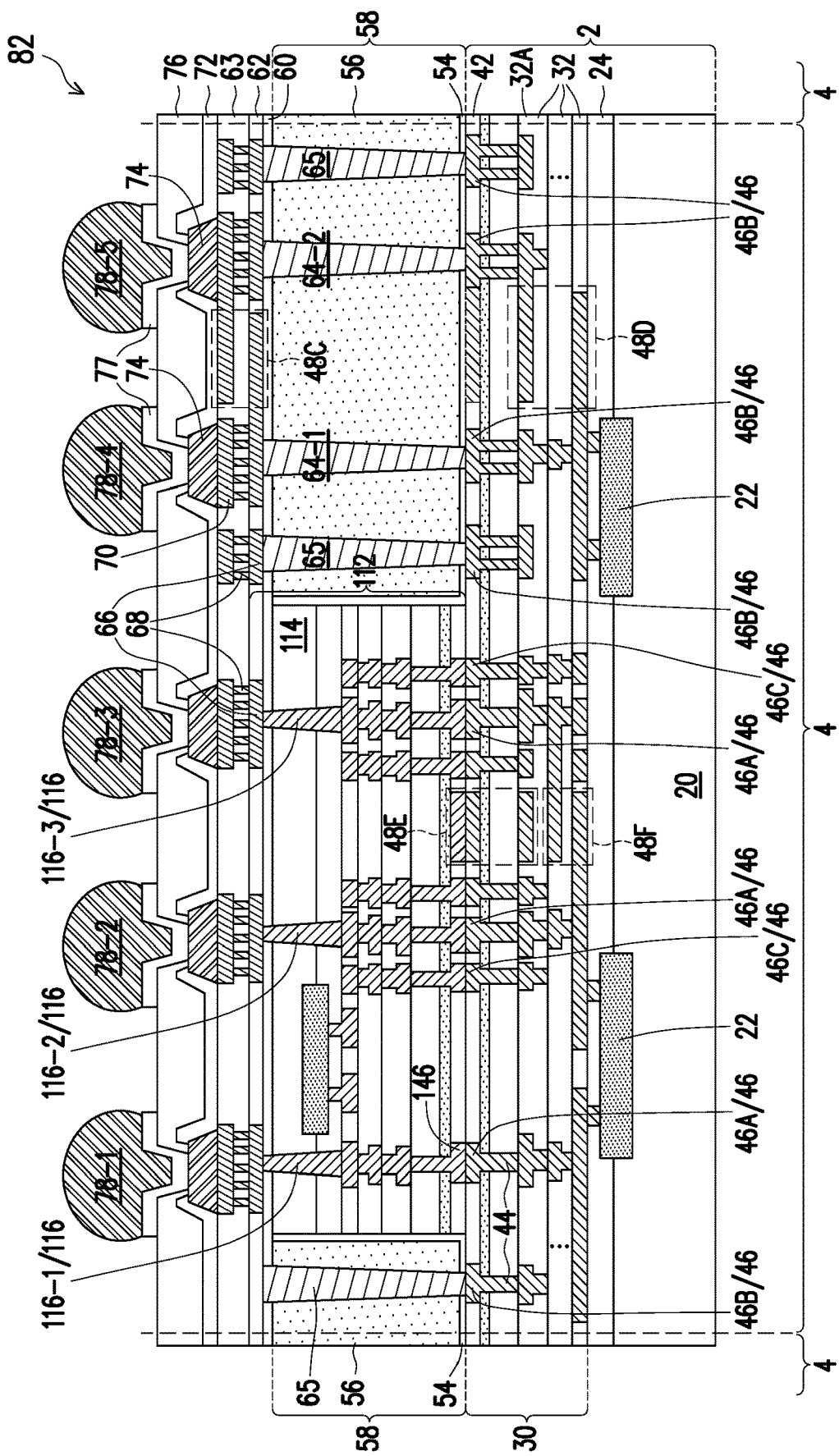
Figure 13:
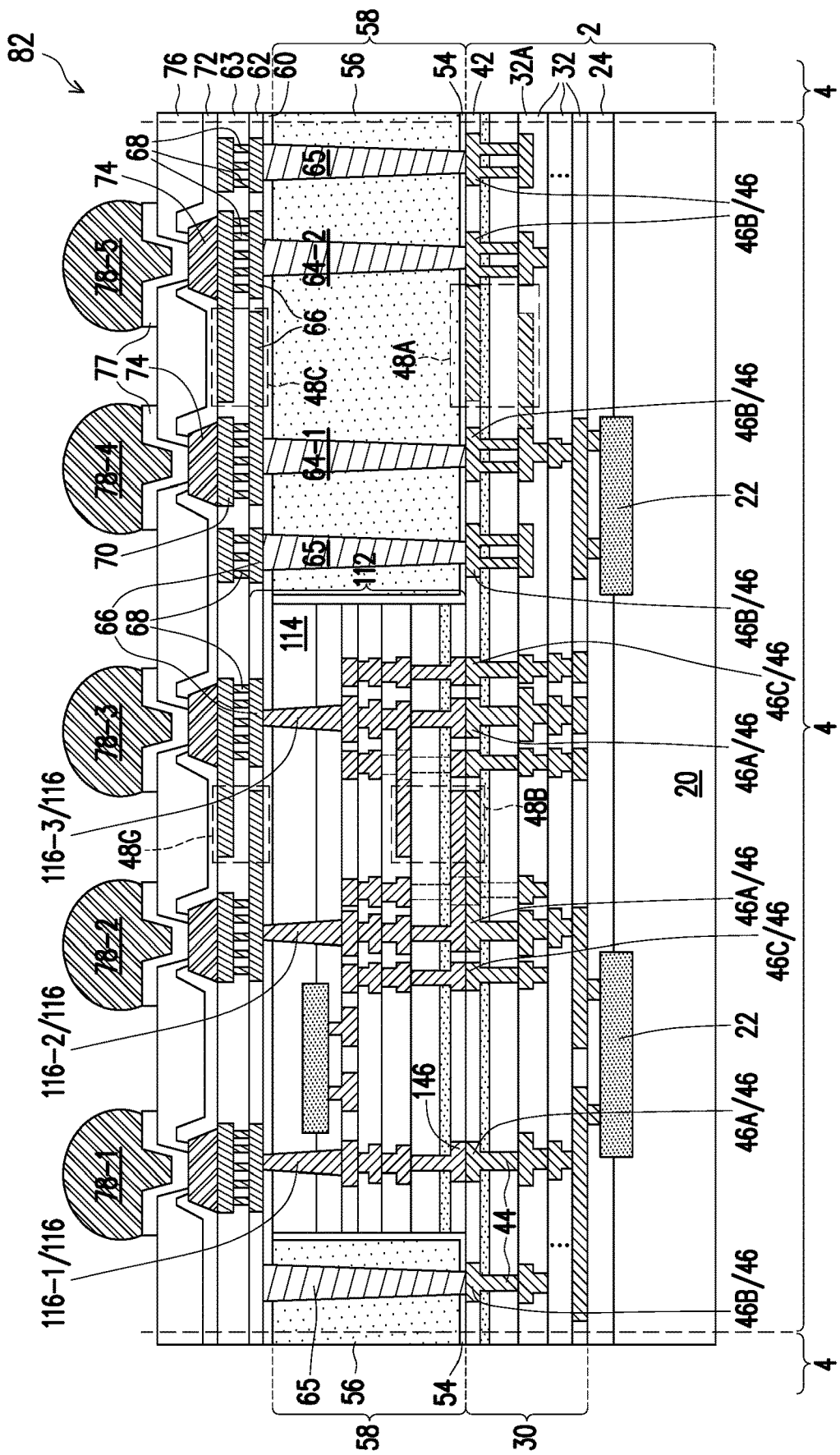

As shown in FIG. 10, each of passive devices 48 (such as 48A, 48B, 48C, and passive devices 48D through 48G as shown in FIGS. 11 through 13) include two terminals (TA and TB in FIGS. 15 and 16), each electrically connecting to one of electrical connectors 78 and one of TSVs 116. For example, FIG. 10 illustrates exemplary electrical connectors 78-1, 78-2, 78-3, 78-4, and 78-5, which are connected to TSVs 116-1, 116-2, 116-3, 64-1, and 64-2, respectively. In accordance with some embodiments of the present disclosure, each of passive devices 48A and 48C is electrically connected to through-vias 64-1 and 64-2, which are further connected to electrical connectors 78-4 and 78-5. It is appreciated that one or both of passive devices 48A and 48C may be formed in accordance with some embodiments. Also, when both passive devices 48A and 48C are formed, passive devices 48A and 48C may be different types of passive devices to form circuits such as LC circuits, RC circuits, RL circuits. Passive devices 48A and 48C may also be the same types of passive devices such as capacitors. This may results an increase in the capacitance without increasing the occupied chip area. Similarly, other passive devices such as passive device 48B are also connected two solder regions (such as 78-2 and 78-3).

In accordance with some embodiments of the present disclosure, as shown in FIG. 10, passive devices 48 are formed in package 82, and may be, or may not be, electrically connected to and used by, the integrated circuits inside package 82. The two terminals of each of passive devices 48 are connected outside of package 82. Accordingly, passive devices 48 also have the same function as Surface-Mount Device (SMD), also known as Integrated Passive Device (IPD). When package 82 is packaged with other package components to form bigger packages, the other package components may access and use the passive devices directly through solder regions and TSVs.

Figure 17:
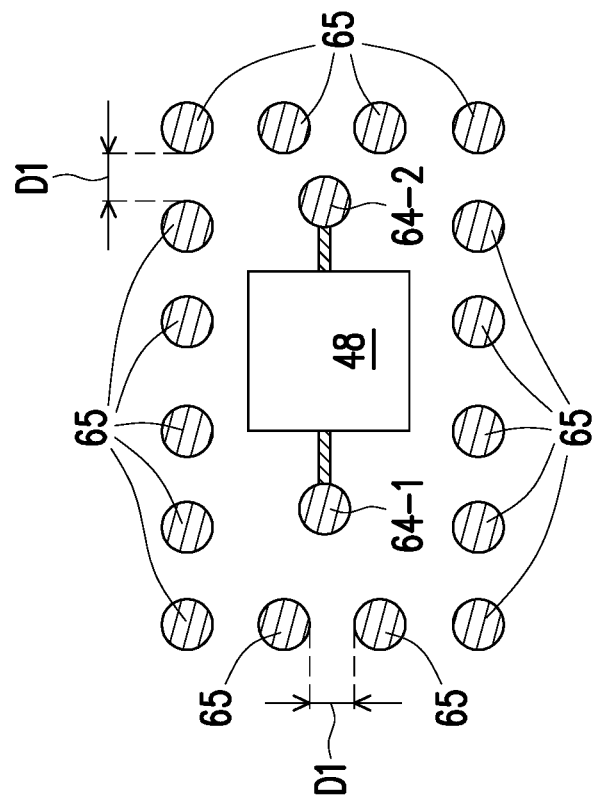
FIGS. 17 and 18 illustrate exemplary passive devices formed in a shielding structure in accordance with some embodiments.
Figure 18:
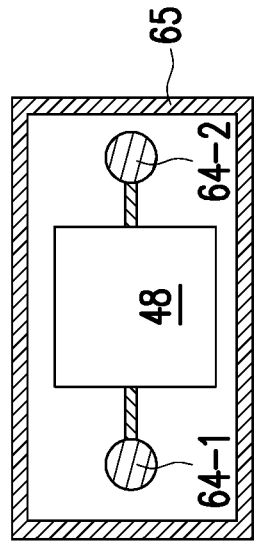

Referring to FIG. 10 again, TDVs 65 penetrate through isolation regions 58, and surround passive device 48. FIG. 17 illustrates a top view of an exemplary layout of TDVs 65, through-vias 64-1 and 64-2, and passive device 48. In accordance with some embodiments, a plurality of TDVs 65 is formed to encircle through-vias 64-1 and 64-2 and the region directly underlying passive device 48 (as shown in FIG. 10). TDVs 65 are close to each other, for example, with distance D1 smaller than about 10 um. TDVs 65 are electrically grounded, and hence form a shielding structure for preventing the interference between passive device 48 and the integrated circuit devices that are outside of the regions encircled by TDVs 65. FIG. 18 illustrates a top view of TDV 65 that forms a full ring encircling through-vias 64 and the region directly underlying passive device 48.

In accordance with some embodiments of the present disclosure, the regions directly over and direct underlying passive devices 48 are free from active devices such as transistors and diodes in order to reduce the interference between passive devices 48 and the integrated circuits. Accordingly, some exclusion zones are designed in device dies 4 and 112, and no active devices are designed in the exclusion zones. Stacking passive devices and design passive devices in the portions of device die 4 that are not overlapped by device die 112 can minimize the required exclusion zones.

FIGS. 11 through 13 illustrate some possible locations for forming passive devices 48. For example, FIG. 11 illustrates that passive device 48D is in the metal layers (which may or may not include top metal layer in dielectric layer 32A), and is formed directly under isolation region 58. Passive device 48D is connected to through-vias 64-1 and 64-2 and electrical connectors 78-4 and 78-5.

FIG. 12 illustrates passive devices 48E and 48F. Passive device 48E includes the bond pads of device dies 4 and 112, which bond pads are bonded to form the top plates of passive device 48E. The bottom plates and vias (if any) are formed in device die 4. Passive device 48F is in metal layers (which may or may not include top metal layer in dielectric layer 32A) in device die 4 and directly under device die 112, and is electrically connected to TSVs 116-2 and 116-3. Passive device 48D is connected to through-vias 64-1 and 64-2 and electrical connectors 78-4 and 78-5. Passive device 48E includes the bond pads of device dies 4 and 112, which bond pads are bonded to form the top plates of passive device 48E. The bottom plates and vias (if any) are formed in device die 4. Passive device 48D is also formed directly under isolation region 58.

FIG. 13 illustrates that passive device 48G is in the RDL layers overlapping device die 112, and are electrically connected to TSVs 116-2 and 116-3. Passive device 48G may overlap passive device 48B, and may be connected in parallel with passive device 48B. It is appreciated that the passive devices 48 as shown in FIGS. 10 through 13 may be formed in the same chip in any combination.

The package shown in FIGS. 1 through 13 has a face-to-face structure, in which device dies 112 have their front surfaces facing the front surface of device die 4. FIG. 14 illustrates a face-to-back structure, in which device die 112 has its front surface facing the back surface of device die 4. Device die 4 includes TSVs 16, which extends through substrate 20 and dielectric layer 17. Passive devices 48 are shown as examples. It is appreciated that the passive devices 48 as shown in FIGS. 10 through 13 may be formed in the package in FIG. 14 whenever applicable, and the details of the passive devices 48 may be essentially the same as in FIGS. 10 through 13, and are not repeated herein.

Figure 19:
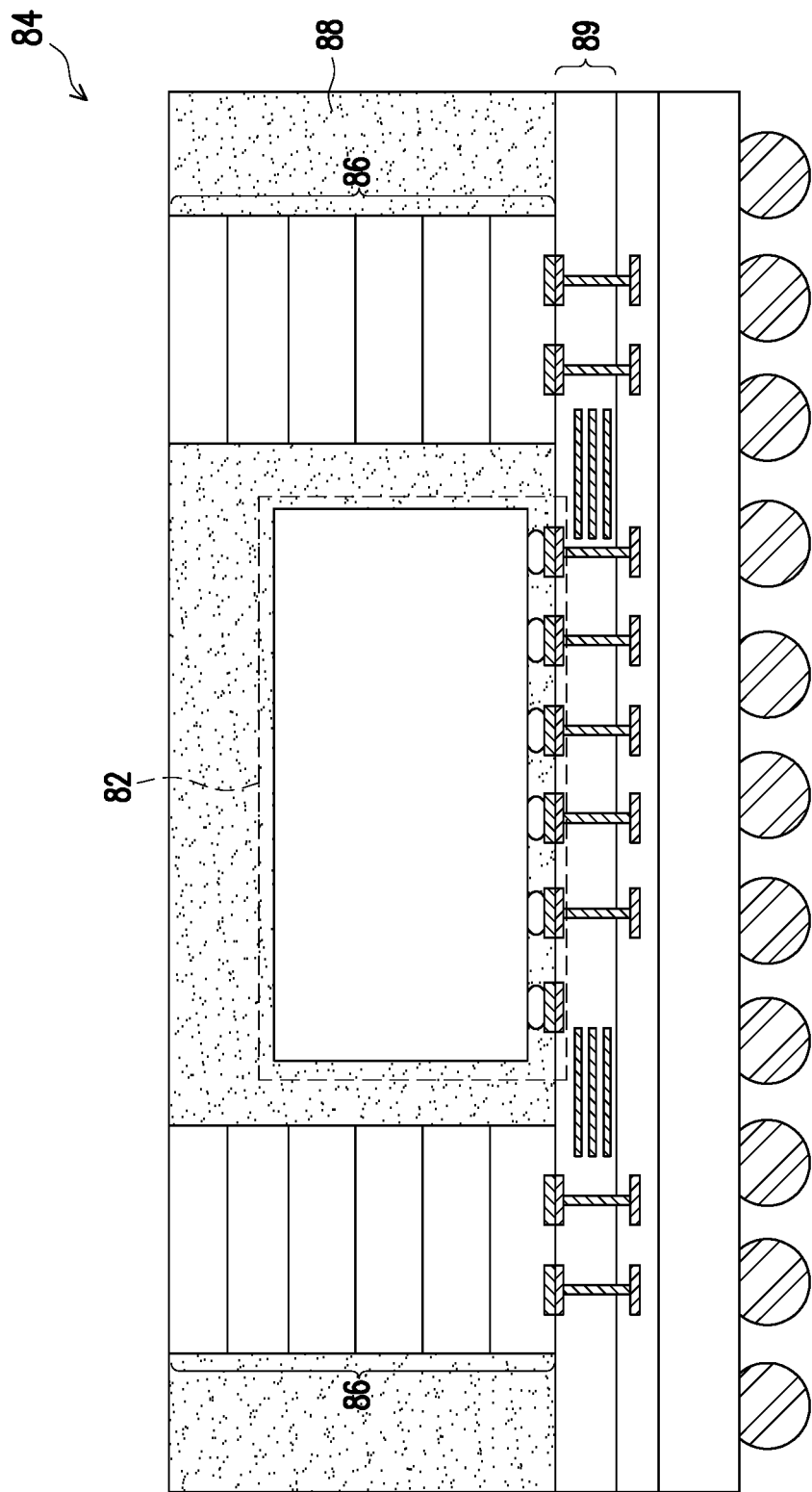
FIGS. 19 and 20 illustrate the cross-sectional views of packages embedding packages in accordance with some embodiments.
Figure 20:
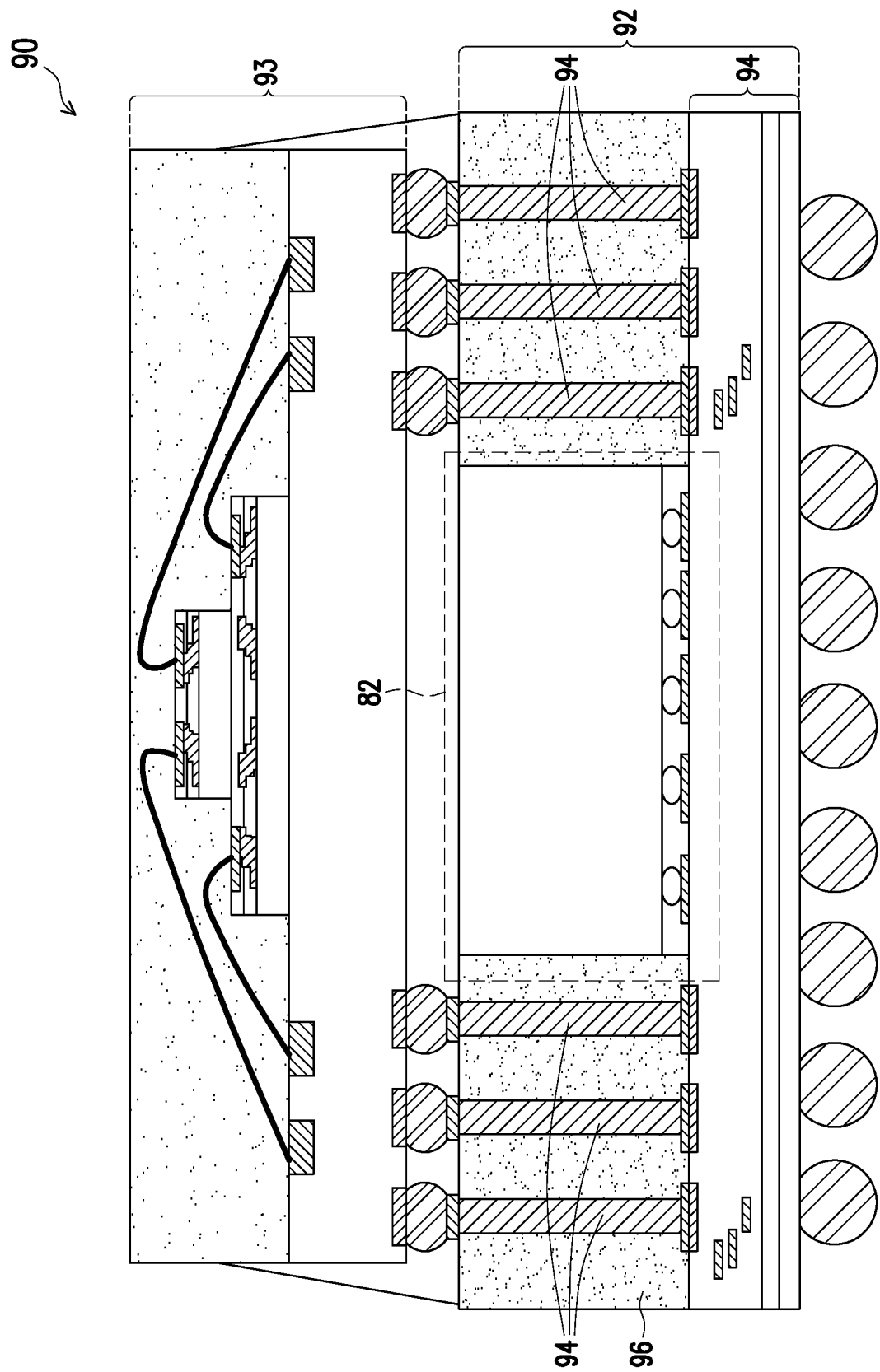

FIGS. 19 and 20 illustrate the bonding of packages 82 to other package components. The respective process is illustrated as step 218 in the process flow shown in FIG. 21. FIG. 19 illustrates package 84 in which package 82 (FIGS. 10 through 14) is embedded. The package includes memory cubes 86, which include a plurality of stacked memory dies (not shown separately). Package 82 and memory cubes 86 are encapsulated in encapsulating material 88, which may be a molding compound. Dielectric layers and RDLs (collectively illustrated as 89) are underlying and connected to package 82 and memory cubes 86. Passive devices 48 in package 82 may be accessed by memory cubes 86 or the package components that are bonded to package 84.

FIG. 20 illustrates Package-on-Package (PoP) structure 90, which has Integrated Fan-Out (InFO) package 92 bonded with top package 93. InFO package 90 also includes package 82 embedded therein. Package 82 and through-vias 94 are encapsulated in encapsulating material 96, which may be a molding compound. Package 82 is bonded to dielectric layers and RDLs, which are collectively referred to as interconnect structure 95. Passive devices 48 in package 82 (not shown in FIG. 20, refer to FIGS. 10 through 14) may be accessed by top package 93 or the package components that are bonded to package 90.

The embodiments of the present disclosure have some advantageous features. By integrating passive devices in the package, no SMD is needed, and the manufacturing cost is saved. It is flexible to design the passive devices in the package.

In accordance with some embodiments of the present disclosure, a method includes bonding a first device die with a second device die, wherein the second device die is over the first device die, and wherein a first passive device is formed in a combined structure comprising the first device die and the second device die, and the first passive device comprises a first and a second end; filling a gap-filling material over the first device die, with the gap-filling material comprising portions on opposite sides of the second device die; performing a planarization to reveal the second device die, with a remaining portion of the gap-filling material forming an isolation region; forming a first through-via and a second through-via penetrating through the isolation region to electrically couple to the first device die; and forming a first electrical connector and a second electrical connector electrically coupling to the first end and the second end of the first passive device. In an embodiment, the first electrical connector and the second electrical connector comprise solder regions. In an embodiment, the first end and the second end of the first passive device are connected to the first through-via and the second through-via, respectively. In an embodiment, the first passive device comprises a capacitor. In an embodiment, the first passive device comprises an inductor. In an embodiment, the first device die comprises a first metal pad, and the second device die comprises a second metal pad bonded to the first metal pad, and the bonding further results in a second passive device to be formed, and the first metal pad and the second metal pad in combination form a plate of the second passive device. In an embodiment, the first device die comprises a first portion of a shielding ring, and the second device die comprises a second portion of the shielding ring, and the first portion is bonded to the second portion of the shielding ring, and wherein the shielding ring encircles the second passive device. In an embodiment, the first device die comprises a third passive device comprising a conductive plate, and the gap-filling material is in contact with the conductive plate of the third passive device. In an embodiment, the method further includes forming a plurality of additional through-vias in the isolation region, wherein the plurality of additional through-vias are electrically grounded, and the plurality of additional through-vias in combination encircle a region directly underlying the first passive device.

In accordance with some embodiments of the present disclosure, a method includes bonding a first device die with a second device die, wherein first metal pads in the first device die are bonded to second metal pads in the second device die; encapsulating the second device die in an isolation region; forming dielectric layers over the second device die and the isolation region; forming a first passive device in the dielectric layers; and forming a first solder region and a second solder region over the dielectric layers, wherein the first solder region and the second solder region are electrically connected to opposite terminals of the first passive device. In an embodiment, the method further includes etching the isolation region to form a first opening and a second opening; and forming a first through-via and a second through-via in the first opening and the second opening, respectively, wherein the first through-via and the second through-via are electrically connected to the opposite terminals of the first passive device. In an embodiment, the first passive device overlaps the isolation region, and is vertically misaligned from the second device die. In an embodiment, the first passive device overlaps the second device die. In an embodiment, the first device die is bonded to the second device die through hybrid bonding, and a first surface dielectric layer of the first device die is bonded to a second surface dielectric layer of the second device die.

In accordance with some embodiments of the present disclosure, a package includes a first device die; a second device die over and bonded to the first device die; an isolation region encircling the second device die; a first through-via and a second through-via penetrating through the isolation region to connect respectively to a first bond pad and a second bond pad in the first device die; and a first passive device comprising a first terminal and a second terminal connected to the first through-via and the second through-via, respectively. In an embodiment, the package further includes a first solder region and a second solder region electrically connected to the first terminal and a second terminal, respectively, of the first passive device. In an embodiment, the package further includes a second passive device in the first device die, wherein terminals of the second passive device are connected to the first through-via and the second through-via. In an embodiment, a top plate of the second passive device contacts a bottom surface of the isolation region, and a top surface of the top plate is coplanar with an interface between the first device die and the second device die. In an embodiment, the first device and the second device are bonded through hybrid bonding, with bond pads of the first device die bonded to bond pads of the second device die, and a first surface dielectric layer of the first device die is bonded to a second surface dielectric layer of the second device die, and the second passive device comprises a plate under the first surface dielectric layer. In an embodiment, the package further includes a shielding structure in the isolation region, wherein the shielding structure encircles the first through-via and the second through-via.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package comprising:
   a first device die;
   a second device die over and directly bonded to the first device die;
   an isolation region encircling the second device die, wherein the isolation region extends along opposing sidewalls of the second device die;
   a first through-via and a second through-via penetrating through the isolation region to contact a first bond pad and a second bond pad, respectively, in the first device die, wherein an interface between the first through-via and the first bond pad is level with an interface between the first device die and the second device die; and
   a first capacitor comprising:
      a first capacitor plate comprising a first portion and a second portion, wherein the first portion is in a first one of the first device die and the second device die, wherein the second portion is in a second one of the first device die and the second device die, wherein the second portion is bonded to the first portion; and
      a second capacitor plate in the second one of the first device die and the second device die.

2. The package of claim 1, wherein the first one of the first device die and the second device die is the first device die.

3. The package of claim 1, wherein the first one of the first device die and the second device die is the second device die.

4. The package of claim 1 further comprising:
   a second capacitor over both of the second device die and the isolation region.

5. The package of claim 1 further comprising:
   a first solder region and a second solder region over the second device die and electrically connecting to the first through-via and the second through-via respectively.

6. The package of claim 1 further comprising a second capacitor in the first device die, wherein the second capacitor comprises a top capacitor plate and a bottom capacitor plate connecting to the first through-via and the second through-via, respectively.

7. The package of claim 1, wherein the first device die and the second device die are bonded through hybrid bonding, with first bond pads of the first device die bonded to second bond pads of the second device die, and a first surface dielectric layer of the first device die is bonded to a second surface dielectric layer of the second device die.

8. The package of claim 1 further comprising a shielding structure in the isolation region, wherein the shielding structure encircles the first through-via and the second through-via.

9. The package of claim 1 further comprising:
   an etch stop layer disposed between the first capacitor plate and the second capacitor plate.

10. A package comprising:
    a first device die;
    a second device die over and directly bonded to the first device die;
    an isolation region encircling the second device die, wherein the isolation region extends along opposing sidewalls of the second device die;
    a first through-via and a second through-via penetrating through the isolation region to contact a first bond pad and a second bond pad, respectively, in the first device die, wherein an interface between the first through-via and the first bond pad is level with an interface between the first device die and the second device die;
    a first capacitor comprising:
       a first capacitor plate comprising a first portion in a first one of the first device die and the second device die; and
       a second capacitor plate in a the second one of the first device die and the second device die; and
    a second capacitor in the first device die, wherein the second capacitor comprises a top capacitor plate and a bottom capacitor plate connecting to the first through-via and the second through-via, respectively, wherein the top capacitor plate of the second capacitor contacts a bottom surface of the isolation region, and a top surface of the top capacitor plate is coplanar with the interface between the first device die and the second device die.

11. A package comprising:
a first device die, wherein the first device die comprises:
  a first surface dielectric layer; and
  a first metal feature in the first surface dielectric layer;
a second device die over the first device die, wherein the second device die comprises:
  a second surface dielectric layer bonded to the first surface dielectric layer;
  a first dielectric layer, wherein the second surface dielectric layer is interposed between the first dielectric layer and the first device die; and
  a second metal feature in the second surface dielectric layer, wherein the second metal feature is bonded to the first metal feature; and
a passive device comprising:
  a first portion in the second device die, wherein the first metal feature and the second metal feature are in combination a second portion of the passive device, wherein the first dielectric layer extends between the first portion and the first device die.

12. The package of claim 11, wherein the passive device comprises a capacitor, and the first portion of the capacitor comprises a first capacitor plate of the capacitor, and the second portion of the capacitor comprises a second capacitor plate of the capacitor.

13. The package of claim 11, wherein the passive device comprises an inductor, and the first portion of the inductor comprises a first metal plate of the inductor, and the second portion of the inductor comprises a second metal plate of the inductor, and the inductor further comprises a via in the second device die, with the via connecting the first metal plate to the second metal plate.

14. The package of claim 11, wherein the first metal feature and the second metal feature are bonded to each other through metal-to-metal direct bonding.

15. The package of claim 11 further comprising:
an isolation region encircling the second device die;
  a first through-via and a second through-via penetrating through the isolation region; and
  a capacitor in the first device die, wherein the first through-via and the second through-via are electrically connected to capacitor plates of the capacitor.

16. A package comprising:
a first device die comprising a first metal feature; and
a second device die over and bonded to the first device die, wherein the second device die comprises:
  a second metal feature directly bonded to the first metal feature to jointly form a bottom capacitor plate of a capacitor;
  a dielectric layer over the second metal feature, wherein the dielectric layer comprises a portion acting as a capacitor insulator of the capacitor;
  a top capacitor plate;
  a semiconductor substrate over the top capacitor plate; and
  a first through-via and a second through-via penetrating through the semiconductor substrate, wherein the first through-via and the second through-via are electrically connected to the top capacitor plate and the bottom capacitor plate, respectively.

17. The package of claim 16 further comprising:
an isolation region encircling the second device die;
an additional dielectric layer over and contacting both of the second device die and the isolation region; and
a first electrical connector and a second electrical connector over the dielectric layer and electrically coupling to the capacitor through the first through-via and the second through-via.

18. The package of claim 16, wherein first opposing edges of the first metal feature are flush with corresponding second opposing edges of the second metal feature.

19. The package of claim 16, wherein the first device die further comprises active devices electrically connecting to the capacitor.

20. The package of claim 16, wherein the first device die further comprises a first surface dielectric layer, and the second device die further comprises a second surface dielectric layer bonding to the first surface dielectric layer through fusion bonding.

* * * * *